US009590559B2

(12) United States Patent
Jarnason et al.

(10) Patent No.: US 9,590,559 B2
(45) Date of Patent: Mar. 7, 2017

(54) MONITORING SYSTEM

(71) Applicant: Solar Analytics Pty Ltd., Redfern (AU)

(72) Inventors: Stefan Jarnason, Alexandria (AU); Avantika Basu, Bondi Junction (AU); Valantis Vais, Beverley Park (AU)

(73) Assignee: SOLAR ANALYTICS PTY LTD., North Sydney, NSW (AU)

( * ) Notice: Subject to any disclaimer, the term of this patent is extended or adjusted under 35 U.S.C. 154(b) by 685 days.

(21) Appl. No.: 14/084,462

(22) Filed: Nov. 19, 2013

(65) Prior Publication Data
US 2014/0149076 A1    May 29, 2014

(30) Foreign Application Priority Data
Nov. 23, 2012    (AU) ................................ 2012905100

(51) Int. Cl.
  *G01R 31/26*    (2014.01)
  *H02S 50/10*    (2014.01)
  *H04Q 9/00*    (2006.01)
  *H01L 31/02*    (2006.01)

(52) U.S. Cl.
  CPC ........ *H02S 50/10* (2014.12); *H01L 31/02021* (2013.01); *H04Q 9/00* (2013.01); *H04Q 2209/823* (2013.01); *H04Q 2209/886* (2013.01); *Y02E 10/50* (2013.01)

(58) Field of Classification Search
  CPC ........ H01L 31/02021; H04Q 2209/823; H04Q 9/00; H04Q 2209/886; Y02E 10/50
  USPC .................... 702/182; 340/635, 657; 307/71; 136/244; 375/240, 229, 233, 287, 288; 324/51, 96, 126, 127, 133, 156; 439/958, 439/822
  See application file for complete search history.

(56) References Cited

U.S. PATENT DOCUMENTS

| 4,002,975 A * | 1/1977 | Erickson ............. G01R 15/242 324/501 |
| 7,620,101 B1 * | 11/2009 | Jenkins .................. H04B 3/143 375/229 |
| 7,750,621 B1 * | 7/2010 | Liu .................... G01R 1/06788 324/126 |

(Continued)

OTHER PUBLICATIONS

Australian IP Office, Patent Examination Report No. 1, Patent Application No. 2013257529, Date of issue Nov. 27, 2015, 6 pages.

*Primary Examiner* — Carol S Tsai

(57) ABSTRACT

A method for analyzing performance of a solar photovoltaic installation data indicating measured value of power generated by the photovoltaic installation receives and stores that data in a database. An expected output of the installation for at least one period of a test day using a first method is determined. The first expected output of the installation is compared with the measured value of power generated. If the expected output of the installation determined by the first method differs from the measured value by more than an acceptable tolerance, an expected output using another method is determined. If the expected output of the installation determined by the other method differs from the measured value by more than an acceptable tolerance, an under performance warning for the solar photovoltaic installation is issued.

17 Claims, 10 Drawing Sheets

(56) References Cited

U.S. PATENT DOCUMENTS

| | | | | |
|---|---|---|---|---|
| 8,410,950 | B2* | 4/2013 | Takehara | H01L 31/02021 136/244 |
| 8,892,411 | B2* | 11/2014 | Tsuruta | G06F 17/5009 136/244 |
| 9,106,104 | B2* | 8/2015 | Kinjo | H02J 3/32 |
| 2011/0037600 | A1* | 2/2011 | Takehara | H01L 31/02021 340/635 |
| 2012/0116696 | A1 | 5/2012 | Wank | |
| 2012/0166085 | A1 | 6/2012 | Gevorkian | |
| 2012/0223670 | A1* | 9/2012 | Kinjo | H02J 3/32 320/103 |
| 2013/0085729 | A1* | 4/2013 | Tsuruta | G06F 17/5009 703/2 |
| 2013/0249297 | A1* | 9/2013 | Takehara | H02J 1/00 307/71 |
| 2014/0340075 | A1* | 11/2014 | Doi | G01D 4/002 324/113 |
| 2016/0026740 | A1* | 1/2016 | Herzig | G01W 1/12 703/2 |

\* cited by examiner

MONITORING SYSTEM

FIELD OF THE INVENTION

The present invention relates generally to the field of performance evaluation of solar photovoltaic systems and in particular the novel use of algorithms to detect underperformance in installed solar photovoltaic systems.

BACKGROUND

As the technical and commercial viability of solar photovoltaic technology has increased, the implementation of this technology has boomed. The solar photovoltaic industry is unique in that module manufacturers typically warrant their products for operation over 25 years. Other array components are also often warranted for at least 5 years with extended warranties becoming common practice. While photovoltaic modules and their auxiliary components are reliable, faults can and do occur. This highlights the need for robust and reliable monitoring to ensure that a solar photovoltaic system performs as it should and alert an owner in the event of a fault.

Many monitoring devices and solutions are available on the market today to inform an owner about the performance of their solar photovoltaic system. Of these solutions, there are four main categories of products available to an owner of a solar photovoltaic systems of all sizes; string level, AC output metering, inverter integrated and stand alone units.

For the purpose of this document, a small scale system is defined as a photovoltaic system equal to or smaller than 10 kWp, typically installed on residential buildings, a medium scale photovoltaic system is greater than 10 kWp and equal to or smaller than 1 MWp, typically installed on commercial buildings and a large scale photovoltaic system is greater than 1 MWp and is typically found in free field installations.

String monitoring is typically employed on large scale deployment of solar photovoltaics. This form of monitoring measures the DC power output of input strings on the system. A sample embodiment of this monitoring concept makes use of algorithms and processing techniques to compare similar strings to each other, thereby enabling isolation of any faulty individual string that does not match the whole. This is possible because the DC side of large scale photovoltaic systems have numerous strings available that can be individually monitored and compared. String monitoring requires hardwiring of copper or optical fibre cable from the string monitoring unit to a local computer. The data from the string monitor is then visualised in some form through dedicated software. In recent years, string monitoring solutions have become commonplace in large scale solar photovoltaic systems.

Although commonplace in larger systems where multiple strings are available for comparison, this form of monitoring is ineffective for small to medium scale solar photovoltaic systems. The cause of ineffective comparison monitoring is due to most small scale systems consisting of a single string of solar photovoltaic modules thus not allowing for any comparison. The typical small scale system consists of 2 or fewer strings and comparison between only 2 variables is inconclusive unless a major fault occurs. For medium scale systems, comparison monitoring poses similar problems. Medium scale photovoltaic systems typically have a larger number of strings than small scale systems, but equally as few suitably similar strings are available for comparison particularly since these strings are often unequal, have different installation orientations or different shading impacts.

Another shortcoming of this form of comparison monitoring is that it is not capable of detecting system underperformance where all strings may be uniformly underperforming due to issues such as excessive soiling, whole system shading etc. It is also not capable of detecting inverter faults or underperformance as it is a DC side monitoring solution. This monitoring solution does not provide a means of calculating the expected performance of a photovoltaic system. Instead, it is a means of measuring and comparing outputs and not a measure of overall system performance.

Over the past 10 years, the most common monitoring solution available to small to medium scale solar photovoltaic system owners is the monitoring capability integrated in the systems power conditioning unit, the inverter. This monitoring solution measures the DC output and AC output of the array it is connected to and is capable of detecting system faults such as electrical problems with grounding, overvoltage and grid failure. As with string monitoring, this solution typically requires hardwiring of copper or optical fibre cable from the inverter to a local computer. Recent developments have seen this length of cable replaced with wireless communication either via Bluetooth or a wireless router. However, hardwiring is still the industry norm. Variations of this topology exist for medium scale systems where a dedicated data logger is installed to receive data from multiple inverters, collate the data and then transmit through a single communication port. The system data from the inverter or data logger is then visualised in some form through dedicated software. Some manufacturers also include access to a web portal for a limited view of key performance metrics thus enabling 'monitoring' of a system from anywhere in the world. A key short coming of this monitoring solution is that it does not provide a means of calculating the expected performance of a photovoltaic system. It is a means of measuring AC output and detecting major inverter faults and not a measure of overall system performance.

A recent development in the field of monitoring solar photovoltaic systems is that of the stand alone monitoring solution. This solution is not tied to an inverter brand and so is a versatile variation of the inverter integrated monitoring platform. Stand alone units typically relay performance data, operating messages and alerts as displayed by the inverter to a local computer. Some stand alone units newly available on the market take this notion one step further by supplementing the inverter communications with other performance metrics such as performance ratio (PR) and normalised system outputs (kWh/kWp/day). Typically, the stand alone solution will offer both hardwiring and integration into an existing wireless network as communication options. As with both previous monitoring solutions, the system data from the inverter or data logger is then visualised in some form through dedicated software and limited view via a web portal.

Failure in communication in these stand alone units is a common cause of failure. To avoid integration into existing internet networks and to increase reliability, providers of this solution typically offer alternate forms of communications as add-ons such as communications through AC mains circuit or radio frequency transmission. However, this adds significantly to the expense of the monitoring solution.

As with all of the assessed monitoring solutions, a shortcoming of this monitoring solution is that it does not provide a means of calculating the expected performance of a photovoltaic system. It is a means of measuring AC output and detecting major inverter faults and not a measure of overall system performance.

An assessment of currently available monitoring platforms reveals that they lack the depth of analysis required to definitively answer the question "Is this photovoltaic system working as it should?" Monitoring solutions available to the solar photovoltaic system owner today, as described above, have either been designed for large scale systems, and hence are expensive and designed for skilled users, or are too simplistic and limited to provide useful system performance information.

It appears that no prior art monitoring platforms include the use of detailed system simulation modelling and/or statistical analysis in the process of monitoring the system's performance. The intended objective of these monitoring solutions is to detect sudden and significant change in performance or specific electrical faults. A core limitation of these monitoring units is that they are not capable of detecting smaller and more gradual drops in system performance. To do so would require sound comprehension of the operating behaviour of solar photovoltaic systems coupled with detailed manual analysis of data as presented by the monitoring unit.

Shortcomings of prior art monitoring systems include the requirement for detailed, manual analysis to detect the following:
  Gradual declines in system performance, e.g. due to component degradation
  Faults in the system other than that caused by the inverter or major faults
  Fluctuating performance, e.g. due to out of range operating voltage as a result of poor system sizing
  Temporary outages, e.g. due to grid instability causing the inverter to switch off for a short period of time
  Changes to site specific conditions such as shading or soiling

SUMMARY

According to a first aspect, the present invention consists in a system for analysing performance of a solar photovoltaic installation comprising:
  a server remotely connected to the solar photovoltaic installation to receive data from the solar photovoltaic installation indicating a measured value of power generated during at least one period of a test day;
  data storage associated with the server to store the data indicating the measured value of power generated during at least one period of a test day in a solar photovoltaic installation performance database against identification information for the solar photovoltaic installation;
  an expected output determination performed by the server to determine an expected output of the solar photovoltaic installation for the at least one period of the test day using a first method;
  a comparison performed by the server to compare the first expected output of the solar photovoltaic installation with the measured value of power generated by solar photovoltaic installation for the at least one period of the test day;
  a first difference detection performed by the server to provide an out of range indication when the expected output of the solar photovoltaic installation determined by the server using the first method differs from the measured value of power generated by the solar photovoltaic installation for the at least one period of the test day by more than an acceptable tolerance;
  a further comparison performed by the server to compare the measured value of power generated by the solar photovoltaic installation for the at least one period of the test day with an expected output of the solar photovoltaic installation for the at least one period of the test day using at least one further method;
  a further difference detection performed by the server to provide an under performance warning for the solar photovoltaic installation when the expected output of the solar photovoltaic installation determined by the server using the at least one further method differs from the measured power generated by the solar photovoltaic installation for the at least one period of the test day by more than an acceptable difference.

According to a second aspect, the present invention consists in a method for analysing performance of a solar photovoltaic installation comprising:
  in a server remotely connected to the solar photovoltaic installation, receiving data from the solar photovoltaic installation indicating a measured value of power generated during at least one period of a test day and storing the data in a solar photovoltaic installation performance database against identification information for the solar photovoltaic installation;
  the server determining an expected output of the solar photovoltaic installation for the at least one period of the test day using a first method;
  the server comparing the first expected output of the solar photovoltaic installation with the measured power generated for the at least one period of the test day;
  when the expected output of the solar photovoltaic installation determined by the first method differs from the measured value of power generated by the solar photovoltaic installation for the at least one period of the test day by more than an acceptable tolerance, the server determining an expected output of the solar photovoltaic installation for the at least one period of the test day using at least one further method;
  when the expected output of the solar photovoltaic installation determined by the at least one further method differs from the measured value of power generated by the solar photovoltaic installation for the at least one period of the test day by more than an acceptable difference, the server issuing an under performance warning for the solar photovoltaic installation.

According to a third aspect, the present invention consists in a method for analysing performance of a solar photovoltaic installation comprising:
  Receiving by a computer-based system for analysing performance of a solar photovoltaic installation, data indicating a measured value of power generated by the solar photovoltaic installation during at least one period of a test day and storing that data in a solar photovoltaic installation performance database against identification information for the solar photovoltaic installation;
  determining by the computer-based system, an expected output of the solar photovoltaic installation for the at least one period of the test day using a first method;
  comparing by the computer-based system, the first expected output of the solar photovoltaic installation with the measured value of power generated for the at least one period of the test day;
  when the expected output of the solar photovoltaic installation determined by the first method differs from the measured value of power generated by the solar photovoltaic installation for the at least one period of the test day by more than an acceptable tolerance, determining by the computer-based system, an expected output of the solar photovoltaic installation for the at least one period of the test day using at least one further method;

when the expected output of the solar photovoltaic installation determined by the at least one further method differs from the measured value of power generated by the solar photovoltaic installation for the at least one period of the test day by more than an acceptable difference, issuing by the computer-based system, an under performance warning for the solar photovoltaic installation.

The first and further methods of determining the expected output of the solar photovoltaic installation may be selected from:

a) using a simulation model of the solar photovoltaic installation and irradiation data obtained from a meteorological service for the area in which the installation is located and for the at least one period of the test day to calculate an expected output of the solar photovoltaic installation for the at least one period of the test day;

b) using the measured value of power generated by the solar photovoltaic installation for a different day having a level of irradiation which differs by no more than 10% from the level of irradiation on the test day to determine an estimated expected output of the solar photovoltaic installation for the at least one period of the test day;

c) calculating irradiation data by calculating reverse Global Horizontal Irradiance (GHI) for the at least one period of the test day for at least one other monitored solar photovoltaic installation and using the simulation model of the solar photovoltaic installation and the calculated GHI data to calculate an estimated expected output of the solar photovoltaic installation for the at least one period of the test day; and d) identifying other monitored solar photovoltaic installations, retrieving output data of the identified solar photovoltaic installations from the solar photovoltaic installation performance database for a different day having meteorological conditions including a level of irradiation which differs by no more than 10% from the solar irradiation on the test day and using the retrieved output data to calculate an estimated expected output of the solar photovoltaic installation for the at least one period of the test day.

Preferably the first method of determining the expected output of the solar photovoltaic installation will comprise using a simulation model of the solar photovoltaic installation and irradiation data obtained from a meteorological service for the area in which the installation is located and for the at least one period of the test day to calculate an expected output of the solar photovoltaic installation for the at least one period of the test day Preferably the further method of calculating the expected output of the solar photovoltaic installation may comprise any one or more of:

a) using the measured value of power generated by the solar photovoltaic installation for a different day having a level of irradiation which differs by no more than 10% from the irradiation on the test day to determine an estimated expected output of the solar photovoltaic installation for the at least one period of the test day;

b) calculating irradiation data by calculating reverse Global Horizontal Irradiance (GHI) for the at least one period of the test day for at least one other monitored solar photovoltaic installation and using the simulation model of the solar photovoltaic installation and the calculated GHI data to calculate an estimated expected output of the solar photovoltaic installation for the at least one period of the test day; and c) identifying other monitored solar photovoltaic installations, retrieving output data of the identified solar photovoltaic installations from the solar photovoltaic installation performance database for a different day having meteorological conditions including a level of irradiation which differs by no more than 10% from the solar irradiation on the test day and using the retrieved output data to calculate an estimated expected output of the solar photovoltaic installation for the at least one period of the test day.

When more than one further method of determining the expected output of the solar photovoltaic installation is used, an under performance warning will be issued if the comparisons using the further methods each results in an unacceptable difference between the expected and actual performance of the solar photovoltaic installation.

The simulation model of the solar photovoltaic installation may use known characteristics of the solar photovoltaic installation including manufacturers rated output of the solar photovoltaic installation for standard irradiation conditions and the orientation of the solar photovoltaic installation.

The measured value of power generated by the solar photovoltaic installation for the at least one period of the test may be considered to be outside the acceptable tolerance compared to the expected output of the solar photovoltaic installation derived by the first method when:

$$\text{Delta}_{FIRST} = \frac{\text{Measured Output}}{\text{Expected Output (First)}}$$

and when:

$$\text{Delta}_{FIRST} < X$$

where Expected Output (First) is the expected output derived by the first method.

X may have a value of 0.8-0.95 and is preferably 0.85

When $\text{Delta}_{FIRST} \geq X$, whereby the measured value of power generated by the solar photovoltaic installation for the at least one period of the test is within the acceptable tolerance, a further comparison is made of a current value of $\text{Delta}_{FIRST}$ with historical values of $\text{Delta}_{FIRST}$ may be made by taking a median of the $\text{Delta}_{FIRST}$ values for the past N days and comparing this to the median of every period of M consecutive days for up to P periods of M consecutive days within the N day period and if the median values for all P periods of M consecutive days are greater than the median of the initial N day period, then an underperformance event is deemed to have occurred in the past N day period and the step of determining an expected output of the solar photovoltaic installation for the at least one period of the test day using at least one further method is not performed.

In one preferred embodiment, N=10, M=4 and P=7

The solar photovoltaic installation may include a monitoring device comprising at least one power measuring sensor, digital data generation means to generate a digital representation of the power value measured by the power measuring sensor, encoding means to encode the digital data representation of the power value measured by the power measuring sensor into a communications signal and a transmission device to transmit the encoded digital data to a central server and the performance analysis is performed by the central server.

The power measuring sensor may comprise a clamp meter to measure a value of current and a power value may be generated by multiplying the measured value of current by the nominal electrical potential of the cable relative to earth.

The solar photovoltaic installation may alternatively comprise an inverter having a data output providing data representing measured value of power generated by the solar photovoltaic installation, a computer receiving the data output of the inverter and connected to the internet to transmit the data representing measured value of generated by the solar photovoltaic installation power to a central server, and the performance analysis is performed by the central server.

According to a fourth aspect, the present invention consists in a monitoring device comprising at least one power measuring sensor, digital data generation means to generate a digital representation of the power value measured by the power measuring sensor, encoding means to encode the digital data representation of the power value measured by the power measuring sensor into a communications signal and a transmission device to transmit the encoded digital data to a remote location.

The power measuring sensor may comprise a clamp meter arranged to be clamped around a power cable. The clamp meter may measure current such that the power value is generated by multiplying the measured current by the nominal electrical potential of the cable relative to earth. Alternatively the power measuring sensor may be incorporated into an inverter and comprise a data output providing data representing measured power output of the inverter.

The method is preferably a computer implemented method.

DESCRIPTION OF THE DRAWINGS

FIG. 9 diagrammatically illustrates a method of combining the first to fourth algorithms of FIGS. 5 to 8; and.

DETAILED DESCRIPTION

The monitoring system implements a novel solution to robustly and reliably monitor the performance of solar photovoltaic systems and detect underperformance in solar photovoltaic systems. In its preferred embodiment, the broad application of this monitoring solution provides the owner (or other stakeholder) of solar photovoltaic system (the solar photovoltaic system being evaluated) with a clear and concise indication of the actual performance of their system relative to expected performance on multiple levels. More specifically, various embodiments of the monitoring system may provide intuitive and visually informative information to the owner (or other stakeholder) regarding the actual performance of their small or medium scale, solar photovoltaic system, relative to expected performance, by monitoring the AC power output and other outputs as recorded by a stand-alone monitoring unit (211 in FIGS. 2 & 3) or system inverter (204 in FIG. 4).

Embodiments of monitoring system may also provide one or more of the following features.

Figure 1:
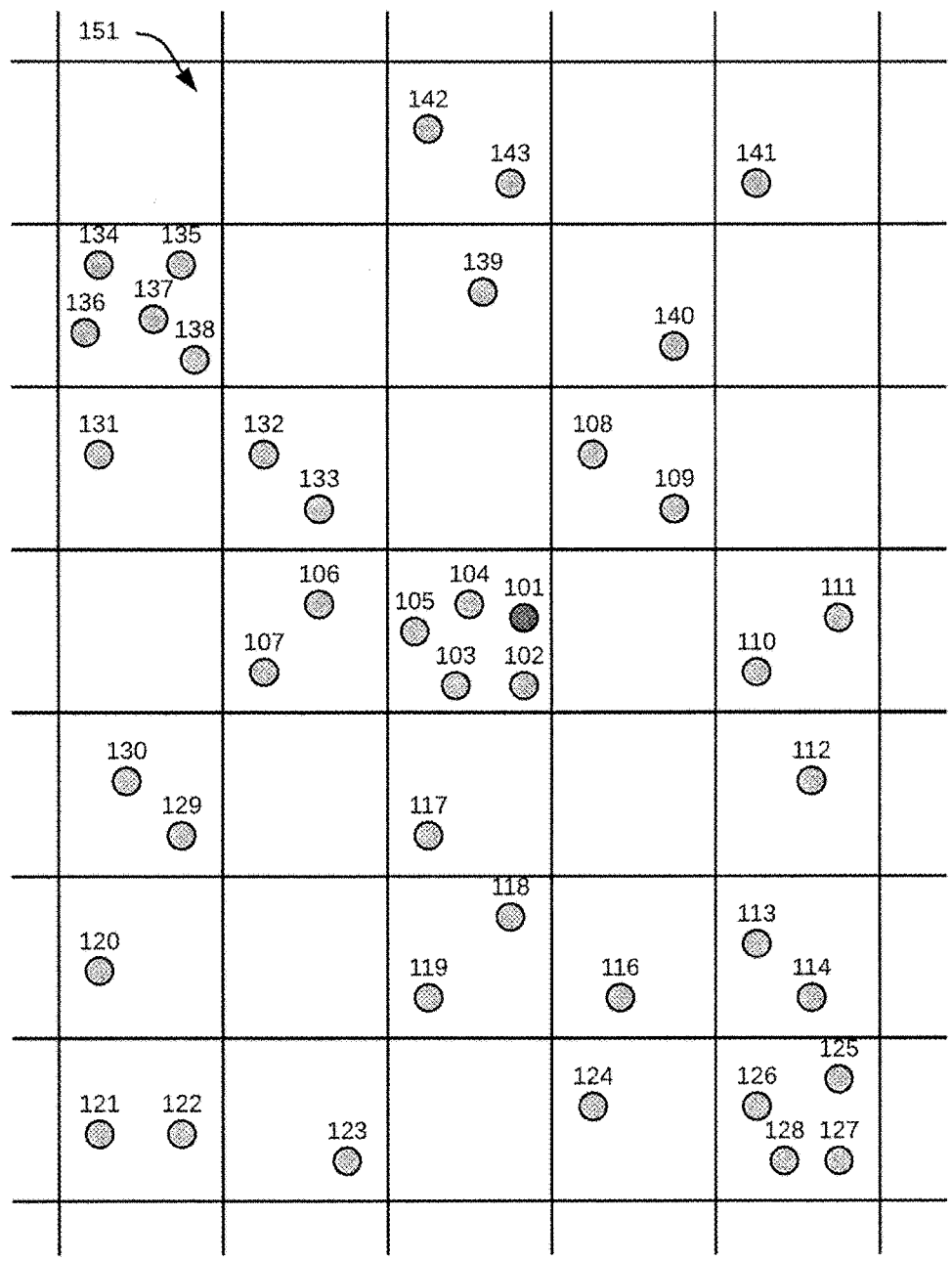
FIG. 1 diagrammatically illustrates the distribution of a plurality of solar photovoltaic system installations in a matrix of local performance evaluation areas.

- Determination of expected system output as per local weather conditions and specific system information
- Comparison of expected system outputs relative to measured system output allows detailed assessment of the performance and 'health' of the system
- Assessment of expected system output relative to measured results enables faults to be detected that are caused by components other than the inverter
- Assessment of expected system output relative to measured results enables smaller magnitude faults to be detected
- Assessment is capable of detecting and quantifying shading impact
- Calculation of multiple 'expected' results ensures minimal 'false faults'
- Assists fault diagnosis
- Improves array longevity and long term performance
- Reduces warranty obligations for manufacturers by detecting and allowing opportunity to correct minor faults before they become major faults
- Fast and simple installation of monitoring solution hardware
- Automated, on-going monitoring allows faults to be detected immediately
- Low cost complete monitoring solution
- Reduces maintenance costs
- Cloud based solution allowing monitored data to be accessed from any internet portal
- Easily comprehensible visualisation of monitoring results through intuitive and interactive web application interface
- Customisable reporting structure through configurable matrix of results and report timing The monitoring system simultaneously monitors a plurality of solar photovoltaic systems 101 to 143 installed across a region 151 (see FIG. 1), allowing an installation performance database of solar photovoltaic system performance information to be accumulated allowing various performance comparisons to be made.

A preferred primary performance indicator comprises comparing the current output of the solar photovoltaic system being evaluated against a simulated output calculated using the known installation parameters of the solar photovoltaic system (e.g. rated output, geographical location, orientation etc.) and environmental parameters for the solar photovoltaic system being evaluated obtained from a meteorological bureau for the current day (e.g. insolation, temperature wind sped etc.).

When the preferred primary performance indicator indicates an out of tolerance performance, a secondary performance indicator or indicators may be implemented using the data stored in the performance database to compare performance of the solar photovoltaic system being evaluated with one or more of:

a) a different solar photovoltaic systems on the current day;

b) the historical performance of the solar photovoltaic system being evaluated; and c) an average of several different but similarly configured solar photovoltaic systems on different days having similar characteristics of irradiation, temperature etc.

The monitoring system comprises a combination of local components, associated with each monitored solar photovoltaic system, and central components allowing the local measurements generated at the site of the solar photovoltaic system installation to be centrally processed and compared not only with expected results for the respective site but also with current measurements for nearby solar photovoltaic system sites and historical data held by the central system.

For simplicity of explanation, within this document, an example solar photovoltaic system being monitored and its performance evaluated will be referred to as "the solar photovoltaic system being evaluated" and other solar photovoltaic systems monitored by the same monitoring system will be referred to as "other solar photovoltaic systems being monitored".

It should be noted that the components of the described embodiments of the monitoring system can be used in any combination or permutation that is within the spirit and scope of the presented concept.

A description of a preferred embodiment of the monitoring system is provided below.

Data Monitoring Hardware Device

When a small scale solar photovoltaic system 200 is mounted on a building (e.g. dwelling) 201, cost effective monitoring requires a minimum of locally installed equipment. Measuring the energy generated by the solar photovoltaic system 200 being evaluated and processing the measurement data without undue cost is a key to effective monitoring of such systems. Such systems will include an inverter 204, mounted within or adjacent to a building's electrical meter box 219, a DC interconnection 203 between the solar photovoltaic panels 202 and the inverter 204 and an AC mains interface 208 mounted in the meter box 219 to provide interconnection of the output of the inverter 204, the mains supply 206 (via the lead in cable 207) and the household power circuits (including a general purpose outlet (GPO) 213 in the meter box 219).

Figure 2:
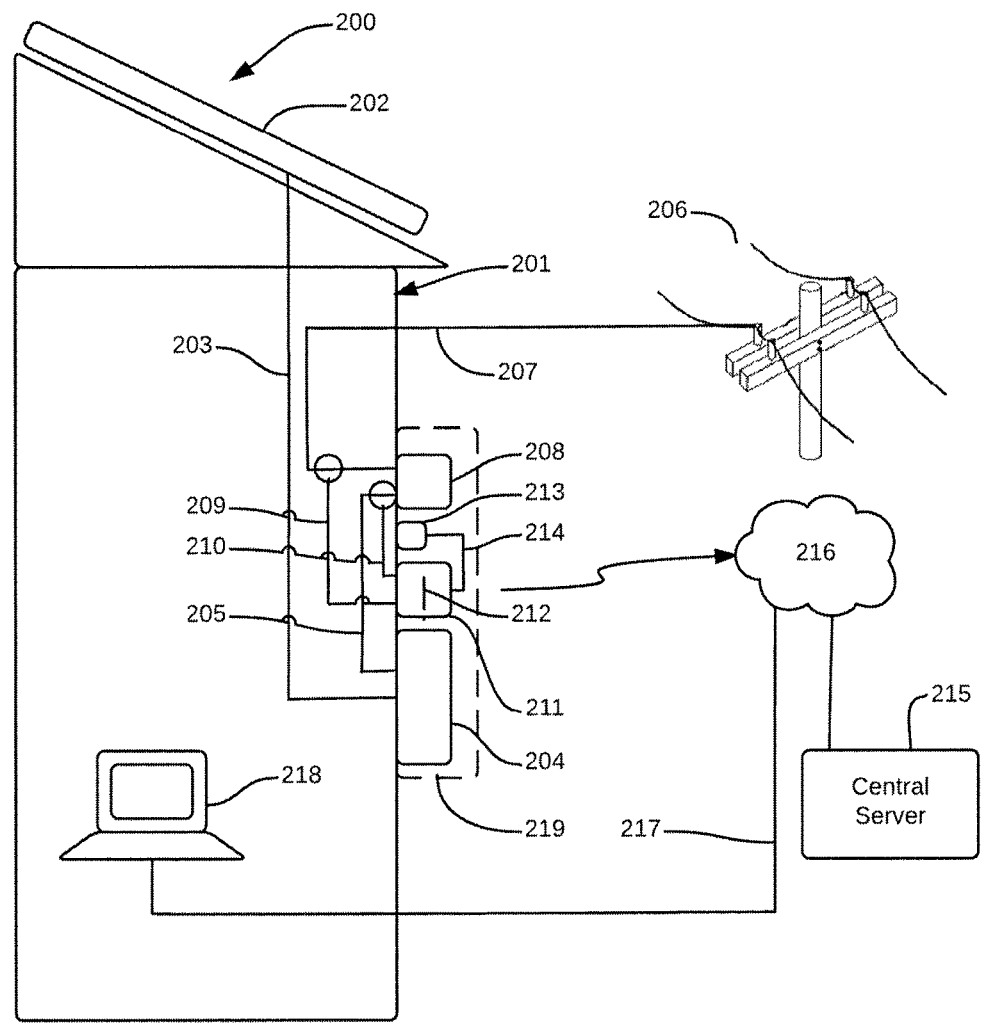
FIG. 2 schematically illustrates a solar photovoltaic system installation on a dwelling and connection to a central monitoring server according to a first method.
Figure 4:
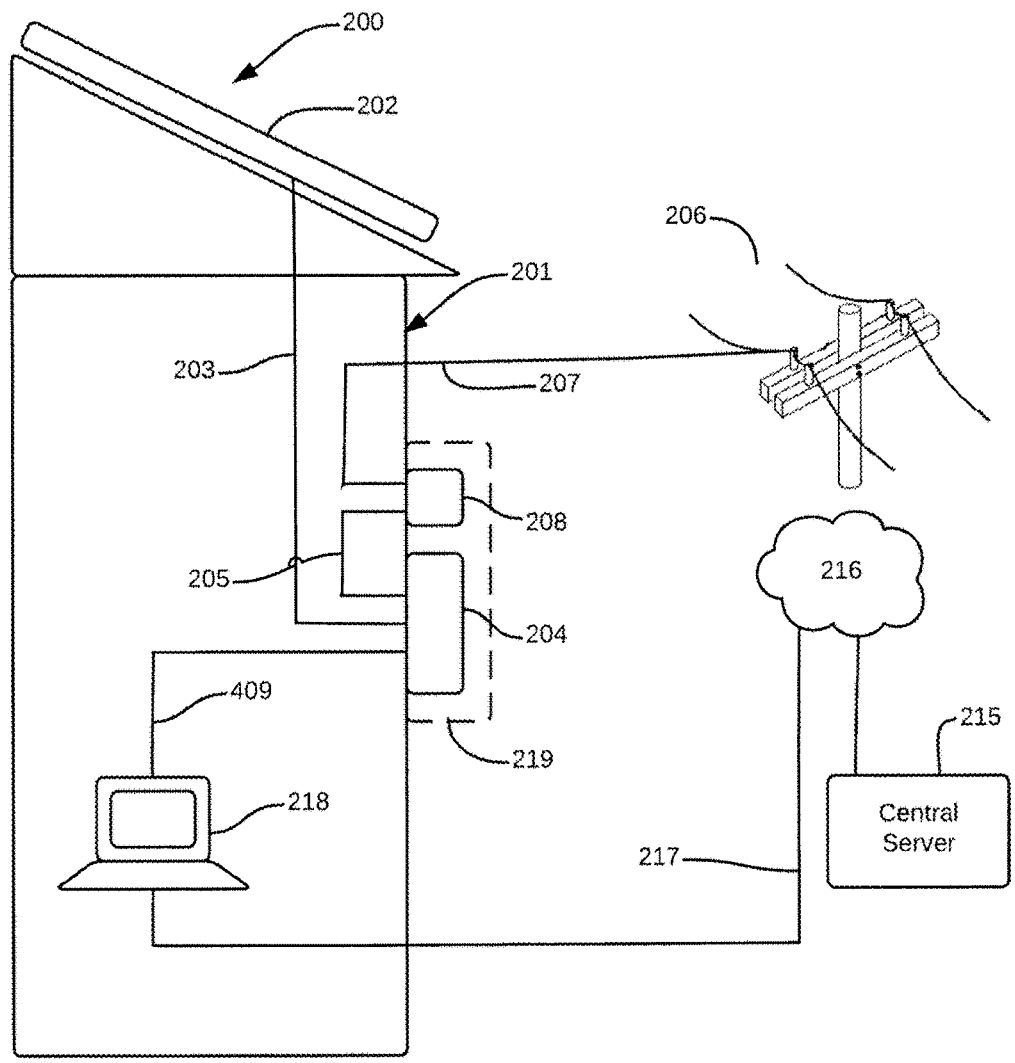
FIG. 4 schematically illustrates a solar photovoltaic system installation on a dwelling and connection to a central monitoring server according to a second method.

Referring to FIGS. 2 and 4, the preferred embodiment of the monitoring system includes implementation of a dedicated hardware device 211 to measure and relay energy generation data to the cloud based server 215 utilised in this monitoring solution. The dedicated hardware may contain any or all of the following components;

Pluggable clamp meter 210 to measure the power generated by the solar photovoltaic system being monitored;

Small a dedicated hardware device 211 which reads the power generated by the clamp meter 210 and conveys the power measurements to the cloud based server 215. The hardware device 211 is installed in a casing which is easily installable inside an electrical meter box 219 of the building;

A Microcontroller 301 within the device 211 to manage measurement calculations via a data input/output interface 303, data logging communications and data compression of the measured generated power;

Internal memory 302 in the hardware device 211 to keep a back-up of logged data;

A communications module within the hardware device 211 capable of wireless communication through either GPRS, HSDPA or other mobile telecommunications network to interconnect the microcontroller 301 with the central server 215 via the internet 216;

SIM card 305 within the communications module 304 to enable use of a mobile network;

External antenna 212 to facilitate wireless communication of the hardware device 211 with a mobile telecommunications network Pluggable standard 12V power supply 214 connected to the GPO 213 in the meter box 219 to ensure the dedicated monitoring hardware device is operational as long as the electrical network grid 205 or the solar photovoltaic system 200 is operational (note that in some regions such as Australia regulations dictate that the solar photovoltaic system must disconnect when the electrical network grid is not operational)

In the preferred embodiment, the power generated by a solar photovoltaic system 200 is measured using the pluggable clamp meter 210. For installation on a small scale solar photovoltaic system located at a residential dwelling, the clamp meter is installed behind the electricity meter and clamped around the live wire 205 from the inverter 204 of the solar photovoltaic system 200. The clamp meter directly plugs into the dedicated hardware 211 which in turn may be mounted inside the electrical meter box 219 of the residential dwelling 201. Optionally mains power usage within the dwelling may also be measured by second clamp meter 209 allowing comparison of solar generation and usage patterns and subsequent optimisation of usage to minimise electricity charges levied by the utility company.

The resident may receive analysis data on their home computer 218 via their connection 217 to the internet 216.

By way of example, the measurements from the clamp meter 210 may be communicated to the cloud based server 215 every 5 minutes for a high resolution view of the operation of the system in question.

Although measuring data using clamp meters 210 is commonplace in industry, the transfer of data from the point of measurement to the point of processing is typically the greatest cause of failure for monitoring solutions considered as 'prior art' in the present application. The cause of failure is the dependency on a local computer to receive and relay the measured data to where it can be processed. Typically this connection can be made by cable or through a wireless router which are prone to errors in initial programming/configuration, resetting these configurations and general disruption from the switching on and off of the local computer.

In this embodiment of the monitoring system, the data is transferred to the cloud based server 215 directly from the data monitoring hardware device 211 via a wireless internet connection. There is no external dependency on a local computer, cabling or router configuration. Thus this solution is a more reliable and robust method of retrieving actual performance data from an installed solar photovoltaic system.

Client Software

Figure 3:
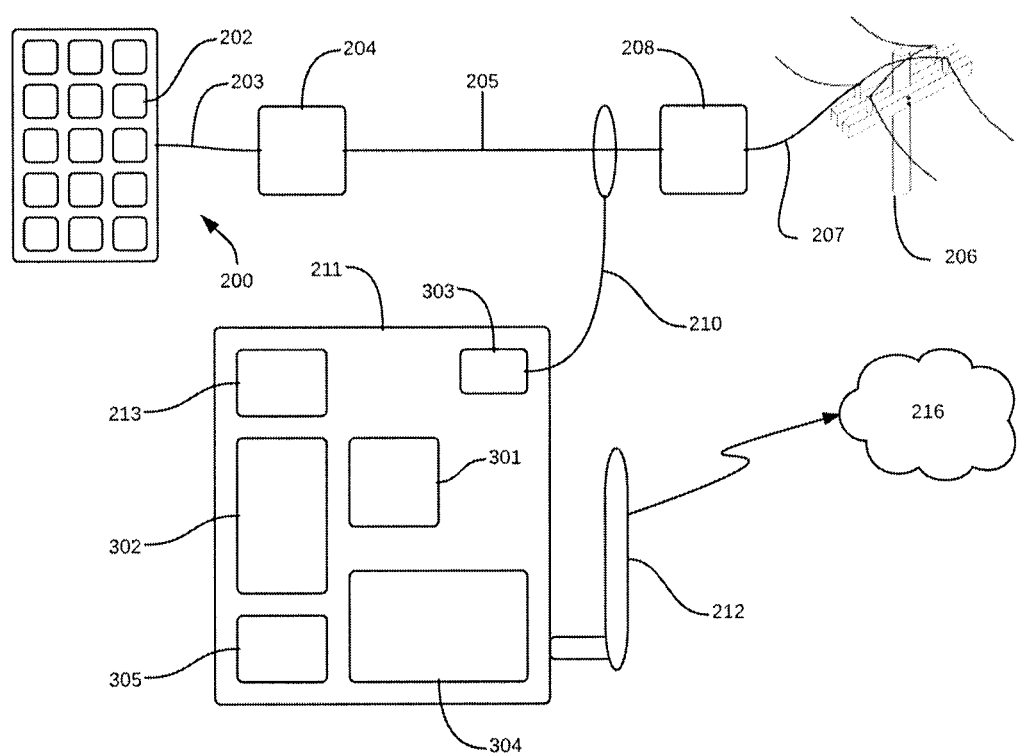
FIG. 3 schematically illustrates a local measurement transmission module of a solar photovoltaic system installation on a dwelling in greater detail.

An alternative to the use of the dedicated hardware device described with reference to FIG. 2 above is the option of utilising available resources from the residents' local computer system 218. Referring to FIG. 3, in which items numbered with like numbers to items in FIG. 2 perform a similar function, client software may be installed on the resident's local computer 218 and the resources of the local computer may be used to perform the functions of the dedicated hardware device 211 as described above, by receiving data indicating inverter power output directly from the inverter 204 via a data connection 409 and transmitting this data to the central server 215 via the internet connection 217. While from a technical viewpoint this may not be the preferred solution, it may be desirable as a low cost alternative to the hardware solution described above. It has the disadvantage that it relies on the client computer 218 being switched on at all relevant times, however this may not be a serious problem if the inverter 204 buffers its output measurements.

The client software may contain any or all of the following components;

Inverter communication component to communicate with one or more inverters 204 and extract relevant information regarding the performance of the solar photovoltaic system 200 in question. This component may vary with inverter manufacturers;

Inverter communication interface to accept the extracted data in the correct format;

Data processing logic to manage recorded data calculations, data logging communications and data compression;

Internal memory to keep a back-up of logged data;

Communications module capable of using available internet connection to send data to a cloud based server;

In the preferred client software implementation, the power generated by a solar photovoltaic system is retrieved from the systems inverter itself. For installation on a small scale solar photovoltaic system located at a residential dwelling, the inverter must have existing communication to the local computer to enable access to this data. This may be achieved through hardwiring of a RS485/RS242 cable or through wireless communication as per the inverters capabilities. The local computer in turn requires internet connection to enable data to be relayed to the cloud based server.

In a sample embodiment, the recorded AC power, DC power, system voltage, irradiation sensor data and temperature sensor data as recorded by the inverter are communicated to the cloud based server every 5 minutes for a high resolution view of the operation of the system in question. An advantage of this solution is that it allows integration of data relating to all parameters measured by the inverter with data from other sources such as instruments to measure weather parameters.

Weather Data Retrieval

A novel feature of the monitoring system is the comparison of actual performance against expected system performance. In order to calculate the expected performance of any energy generation unit, data is required of parameters that influence the performance of the system in question. For a solar photovoltaic system, relevant information comprises electrical configuration, physical configuration, component specifications and quantified measure of the incident weather over the period in question.

The weather plays a key role in determining the energy generation capacity of a solar photovoltaic system. There are several key components of weather that influence this energy generation ability. The most relevant weather component is sunlight or solar irradiation as the amount of solar irradiation incident on a solar photovoltaic system is directly proportional to the input energy to be converted by this device. As such, retrieving an accurate measure of solar irradiation data is crucial to the overall accuracy of the prediction capability of the monitoring system.

In the preferred embodiment of the monitoring system, parameters of weather data used to process and define the meteorological conditions experienced by the solar photovoltaic system are the incident solar irradiation, ambient air temperature and the wind speed at the location of the installed system in question.

The monitoring system implements an automated process by which the weather data is retrieved for use in the calculation of the expected energy output. Weather information is retrieved using a 'file transfer protocol' (ftp) download of data from World Meteorological Organisation (WMO) weather stations as provided by the local weather bureau for a given country/region. The data is retrieved at regular intervals via an automated process run at the central monitoring site which uses the data retrieved to calculate expected outputs for all systems connected to the central site.

Algorithms

The monitoring system implements a novel process to detect underperformance in solar photovoltaic systems. The monitoring system is simplistically defined as the collective use of at least two and up to four different output predictive algorithms, in any given combination, with or without supplementary statistical analysis to perform this objective. In its preferred embodiment the monitoring system is used to detect underperformance in small scale solar photovoltaic systems using a plurality of algorithms for comparison of measured AC energy generation values.

The combined implementation of these algorithms allows the monitoring system to determine whether a given solar photovoltaic system is underperforming by statistically comparing actual system output to expected output, historical output, output from systems in close geographical proximity to the system and historical output of a similar system under similar conditions. By using a plurality of algorithms, false positives (the false detection of an under performance condition) are reduced.

The first algorithm within the monitoring system is a multi-staged algorithm used to calculate the expected energy generation of a given solar photovoltaic system based on;

Geographical location of the site
Local weather conditions
Specific components used in the system
Specific system electrical configuration
Specific system physical configuration
Defined loss factors This algorithm uses modelling techniques to calculate sun position, meteorological conditions on site, DC power generation and finally AC power generation.

The second algorithm within the monitoring system implements a model to compare present day energy output to historical energy output of the system in question on a similar day.

The Third algorithm within the monitoring system implements a multi-staged model to compare the energy output of the system in question to the energy output using reverse calculated solar irradiation from the output(s) of a solar photovoltaic system(s) in close geographical proximity to the system in question on the same day.

The fourth algorithm within the monitoring system implements a model to compare any similar system(s) that are similarly configured to the system in question under similar meteorological conditions historically.

The monitoring system encompasses the use of the algorithms described above in any permutation or combination to identify solar photovoltaic system underperformance.

In the preferred embodiment of the overall solution, the result of the First Algorithm which derives a simulated energy output of the solar photovoltaic system in question is compared to the actual energy generation of the system in a preliminary statistical analysis. If this preliminary analysis deems that the system is underperforming any or all of the Second, Third and Fourth algorithms are implemented to extract alternate 'expected' outputs. Detailed statistical analysis then verifies the initial result from the First algorithm. However it should be noted that it is also possible to use one of the second, third or fourth algorithms as an alternative primary algorithm and only resort to one of the other algorithms when this alternative primary algorithm deems that the system is underperforming.

First Algorithm

Figure 5:
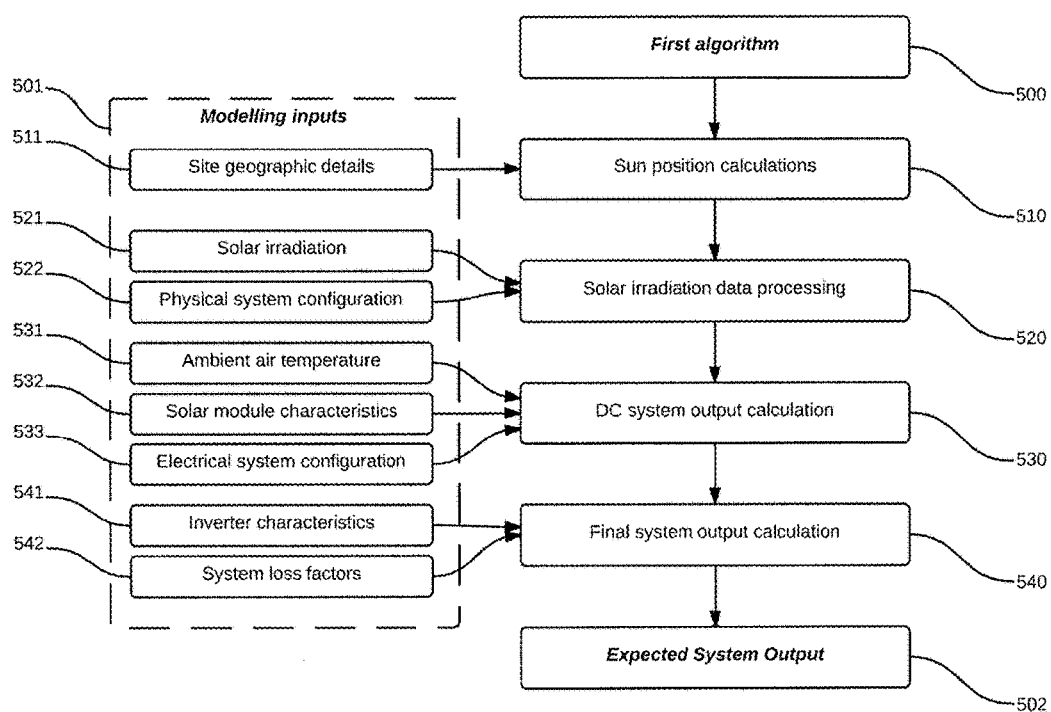
FIG. 5 diagrammatically illustrates a first algorithm for evaluation of solar photovoltaic system performance.

Referring to FIG. 5, the first algorithm 500 is the core component of the monitoring system in its preferred embodiment. It highlights that it is possible to simulate the energy generation (System Output) 502 of a given solar photovoltaic system by accounting for the system design and local weather conditions. In a sample embodiment of the First algorithm, but not the only embodiment, the process consists of four main modelling stages;

1. Sun position calculations 510
2. Solar irradiation data processing 520
3. DC system output calculation 530
4. Final system output calculations 540

Sun position calculations 510 are completed using defined inputs 511 of the date, time, site time zone, site longitude, site latitude and site elevation above sea level. Key output parameters from these calculations are the sun altitude, sun azimuth and air mass at a given hour of a given day for a given location.

The sun position is calculated through the computation of each of the equations below using input of Universal time at the site in question, site latitude, site longitude, site elevation above sea level and the site time zone.

The equations listed below enable calculation of all parameters required to calculate the sun altitude, sun azimuth, air mass and solar constant for a given location.

$J\_day = Universal\_time + 2415018.5$                   Julian Day;

$J\_Day\_N = Universal\_time - 36526.5$                   Julian Day number;

$\Omega = 2.1429 - 0.0010394594 * J\_Day\_N$             Omega;

$Mean\_long = 4.895063 + (0.017202791698 * J\_Day\_N)$   Mean Longitude;

$Mean\_A = 6.24006 + (0.0172019699 * J\_Day\_N)$         Mean Anomaly;

$E\_Long = Mean\_long + 0.03341067 * Sin(Mean\_A) + 0.00034894 * Sin(2 * Mean\_A) - 0.0001134 - 0.0000203 * Sin(\Omega)$   Ecliptic Longitude;

$Obl\_Ec = 0.4090928 - 6.214 * 10^{(-9)} + 0.0000396 * Cos(\Omega)$   Obliquity of the Ecliptic;

$R\_asc = Tan^{-1}(Cos(Obl\_Ec) * Sin(E\_Long) / Cos(E\_Long))$   Right Ascension;

$\delta = Sin^{-1}(Sin(Obl\_Ec) * Sin(E\_Long))$   Declination;

$GMST = 6.69743242 + 0.0657098283 * J\_Day\_N + (Hour\ of\ day)$   Greenwich Mean Sidereal Time;

$LMST = (GMST * 15 + Longitude) * (\pi/180)$   Local Mean Sidereal Time;

$\omega = LMST - R\_asc$   Hour Angle;

$\alpha = Sin^{-1}[Cos(\delta) * Cos(\phi) * Cos(\omega) + Sin(\delta) * Sin(\phi)]$   Suns Altitude;

$v = Sin(\delta) * Cos(\phi) - Cos(\delta) * Sin(\phi) * Cos(\omega) / Cos(\alpha)$   Sun's Azimuth;

$AM = 1/Sin(\alpha) + 0.15 * (3.895 + \pi - \alpha)^{-1.253} * Exp(-0.0001184 * \phi)$   Air Mass;

$SC = 1373 * \{1 + 0.033 * Cos\ [(2\pi * Day\_N + 10) / 365.25]\}$   Solar Constant;

Where;
$\delta$ is the declination angle
$\phi$ is the site latitude
$\omega$ is the hour angle
N is the day number between 1 and 365
$\beta$ is the angle of inclination of the solar module
$v_{module}$ is the azimuth of the solar module defined by, 0=facing the equator
NOCT is the Nominal operating temperature of the solar cell provided by the manufacturer
$G_0$ is the reference radiation taken as 800 W/m2
G is the incident irradiation taken as the value calculated in irradiation modelling
$\Omega_{CABLE}$ is the resistivity of the cable
$C_{CABLE}$ is the cable temperature coefficient per unit Kelvin
N is the number of modules in the system
Using the above calculations, the following sun position parameters can be calculated;

Sun altitude calculation                                                  Equation 1
$\alpha = \sin^{-1}(\cos\delta . \cos\phi . \cos\omega + \sin\delta . \sin\phi)$ Sun azimuth calculation                                                   Equation 2
$v = \sin\delta . \cos\phi - \dfrac{\cos\delta . \sin\phi . \cos\omega}{\cos\alpha}$ Air Mass calculation                                                      Equation 3
$AM = \dfrac{1}{\sin\alpha} + 0.15 * (3.895 + \pi - \alpha) - 1.253 * e^{-0.0001184 * \phi}$ This stage allows determination of the intensity of the available solar irradiation incident on the solar photovoltaic system in the next stage.

Irradiation data processing 520 is a key element of the First algorithm as it calculates the input energy for the system and hence is the key parameter in simulating energy generation. The irradiation modelling process is completed in 3 parts. Firstly, the solar irradiation data 521 is broken down into an hourly profile if not already in this resolution. Secondly the hourly solar irradiation data is then separated into direct and diffuse components. Thirdly, physical system configuration data 522 is used to translate these separated irradiation components to an inclined plane as representative of the solar photovoltaic modules as installed for the system in question.

The array output (DC System Output) 530 is calculated as the next stage of the First algorithm. The cell temperature is calculated from the ambient air temperature 531 for the local site for use in DC power calculations using the relationship;

Module temerature calculation $$T_{Cell} = T_A + \dfrac{NOCT - 20}{G_0} * G$$                          Equation 4

The DC power output 530 of a given solar photovoltaic system is calculated by modelling the behaviour of a solar cell (using the solar module characteristics 532) under the calculated meteorological conditions.

Operating efficiency of the solar module $$\eta = p * \left[\frac{q*G}{G_0} + \left(\frac{G}{G_0}\right)^m\right] * \begin{bmatrix} 1 + \frac{r*\vartheta}{\vartheta_0} + \\ \frac{s*AM}{AM_0} + \\ \left(\frac{AM}{AM_0}\right)^u \end{bmatrix} \quad \text{Equation 5}$$

And

DC power output calculation $$P_{DC} = \eta * A * G \quad \text{Equation 6}$$

Where;
η is the operating efficiency of the solar module
G is the Solar irradiation
$G_0$=1000 W/m²; Solar irradiation at STC=
θ=$θ_a$+hG
θ is the operating cell temperature
$θ_a$=25° C.; Ambient air temperature
θ=25° C.
AM is the Air mass
$AM_1$=1.5; Air mass at STC
$P_{DC}$ is the DC power output of the solar module(s)
A is the active cell area of the module(s)
p, q, m, r, s, u are calculated constants as per the table below.

| Module Technology | p | q | m | r | s | u | h |
|---|---|---|---|---|---|---|---|
| Monocrystalline Silicon (Mono-Si) | 23.62 | −0.2983 | 0.1912 | −0.09307 | −0.9795 | 0.9865 | 0.028 |
| Polycrystalline Silicon (Poly-Si) | 15.39 | −0.177 | 0.0794 | −0.09736 | −0.8998 | 0.9324 | 0.026 |
| Amorphous Silicon (A-Si) | 36.02 | −0.7576 | 0.6601 | −0.02863 | −1.1432 | 1.0322 | 0.022 |
| Copper Indium Diselenide ($CuInSe_2$) | 18.55 | −0.3288 | 0.2612 | −0.10039 | −0.9678 | 0.9864 | 0.032 |

Method as per published literature: "Durisch W., Bitnar B., Mayor J., Kiess H., Lam K., Close J., 'Efficiency model for photovoltaic modules and demonstration of its application to energy yield estimation', Solar Energy Materials and Cells 2007; 91: pp79-84"

At this stage the cable losses (Electrical System Configuration 533) are calculated to determine the input DC power to the inverter; power conditioning unit in the system used to convert DC power to AC power. Cable losses are calculated using the equation;

$$P_{Loss} = I^2 R \quad \text{Equation 7: Power loss calculation}$$

Where R is the cable resistance and found by the equation;

Cable resistance calculation $$R = \Omega_{Cable} * \frac{2L}{A} * [(1 + C_{Cable}(T_{Cable} - 20)] \quad \text{Equation 8}$$

To calculate the final system output 540 of the solar photovoltaic system in question, the AC power output is calculated from DC power output 530 of the system. The inverter behaviour is determined from inverter characteristic data 531 as provided by inverter manufacturers including but not limited to, MPPT voltage window, cut-off power and voltage thresholds and minimum power and voltage thresholds. The inverter efficiency is also determined from data provided by inverter manufacturers and matched to the input DC power. This resultant AC power is then derated (using system loss factors 542) to give a final estimation of energy production over that given hour. This process is completed for every hour within the specified time period of simulation.

$$P_{AC} = P_{DC} \cdot \eta_{INV} \cdot L \quad \text{Equation 9: Final system output calculation}$$

Where 'L' is the overall system derate factor including but not limited to, mismatch loss, module quality loss and soiling loss.

$$L = f_{mismatch} * f_{PV} * f_{soil} \quad \text{Equation 10: Final system output calculation}$$

This gives the expected output 502 of the solar photovoltaic system in question as per simulation using local weather conditions and system configuration details.

As stated above, the preferred embodiment uses the simulated energy generation of the solar photovoltaic system in question, generated by the First Algorithm, as a comparison against the actual energy generation of the system in a preliminary statistical analysis. If this preliminary analysis deems that the system is underperforming then and only then are any or all of the Second, Third and Fourth algorithms are implemented to extract alternate 'expected' outputs. Detailed statistical analysis then verifies the initial result from the First algorithm.

Second Algorithm

Figure 6:
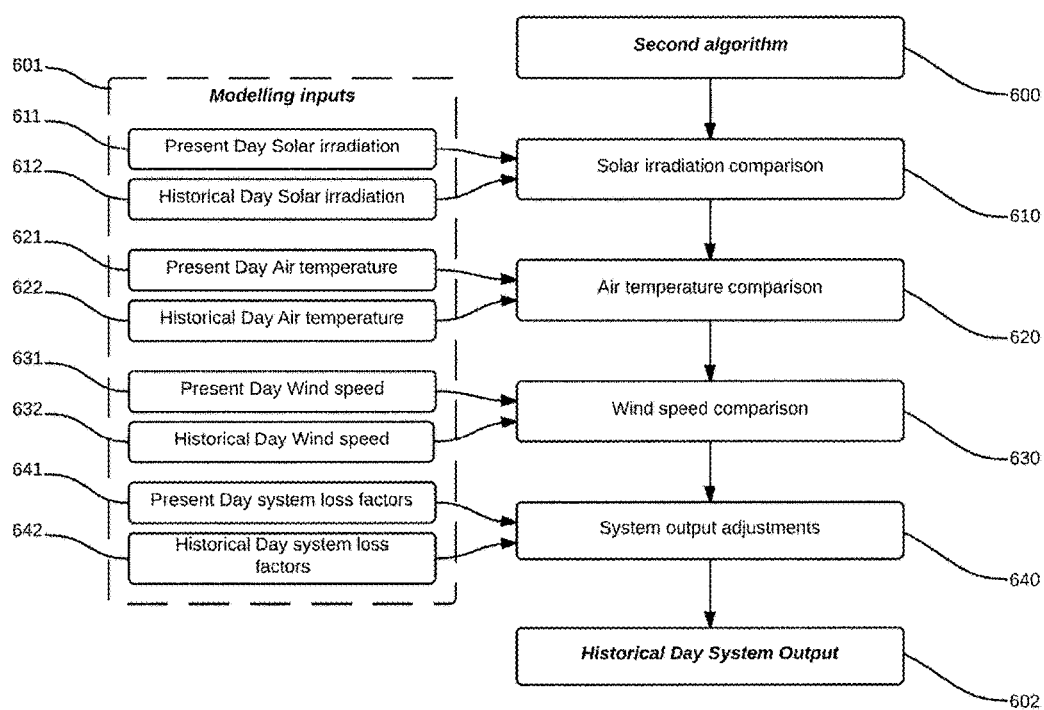
FIG. 6 diagrammatically illustrates a second algorithm for evaluation of solar photovoltaic system performance.

Referring to FIG. 6, the Second Algorithm 600 within the monitoring system implements a model to compare present day energy output to historical energy output (Historical Day System Output 602) of the system in question on a similar day. This algorithm represents the cyclical nature of weather at a site allowing for historical comparison to check for system faults or accelerated degradation. In a sample embodiment of the Second algorithm the process consists of four primary modelling processes;

1. Solar irradiation comparison 610
2. Air temperature comparison 620
3. Wind speed comparison 630
4. System output adjustments 640

In each of the first three of the above stages 610, 620 & 630, the relevant meteorological parameter values are compared to the corresponding present day values to identify suitable days historically where a similar system output would be expected. Each of these three stages has a different tolerance margin dependent on its impact on overall energy generation of a solar photovoltaic system.

When comparing the solar irradiation for the present day to the historical day, the difference between the present day's solar irradiation values 611 and the historical day's solar irradiation values 612 must be less than or equal to 10%. Where a profile is unavailable for the day, the difference between the present day's solar irradiation total and the historical day's daily solar irradiation total must be less than or equal to 10%.

Second algorithm solar irradiation comparison $$0.9 \le \frac{\text{Solar irradiation}_{HISTORICAL}}{\text{Solar irradiation}_{PRESENT}} \le 1.1 \quad \text{Equation 11}$$

When comparing the air temperature for the present day to the historical day, the difference between the present day's air temperature values 621 and the historical day's air temperature values 622 must be less than or equal to 20%. Where a profile is unavailable for the day, the difference between the present day's air temperature average and the historical day's daily air temperature average must be less than or equal to 20%.

Second alogrithm air temerature comparison $$0.8 \le \frac{\text{Air temperature}_{HISTORICAL}}{\text{Air temperature}_{PRESENT}} \le 1.2 \quad \text{Equation 12}$$

When comparing the wind speed for the present day to the historical day, the difference between the present day's wind speed values 631 and the historical day's wind speed values 632 must be less than or equal to 50%. Where a profile is unavailable for the day, the difference between the present day's wind speed average and the historical day's daily wind speed average must be less than or equal to 50%.

Second algorithm wind speed comparison $$0.5 \le \frac{\text{Wind speed}_{HISTORICAL}}{\text{Wind speed}_{PRESENT}} \le 1.5 \quad \text{Equation 13}$$

Once these meteorological parameters are matched to a day in the systems historical operation, the system's historical measured energy output can be extracted. This leads to the final modelling stage of the Second algorithm. The final stage 640 takes the system loss factors as expected for operation on the selected historical day 641 and adjusts these to loss factors expected for the solar photovoltaic system's operation on the present day 642. This correction includes but is not limited to correction of seasonal loss factors such as soiling and age dependent loss factors such as module degradation.

The output 602 of the Second algorithm is the expected output of the solar photovoltaic system in question as per historical performance.

Third Algorithm

Figure 7:
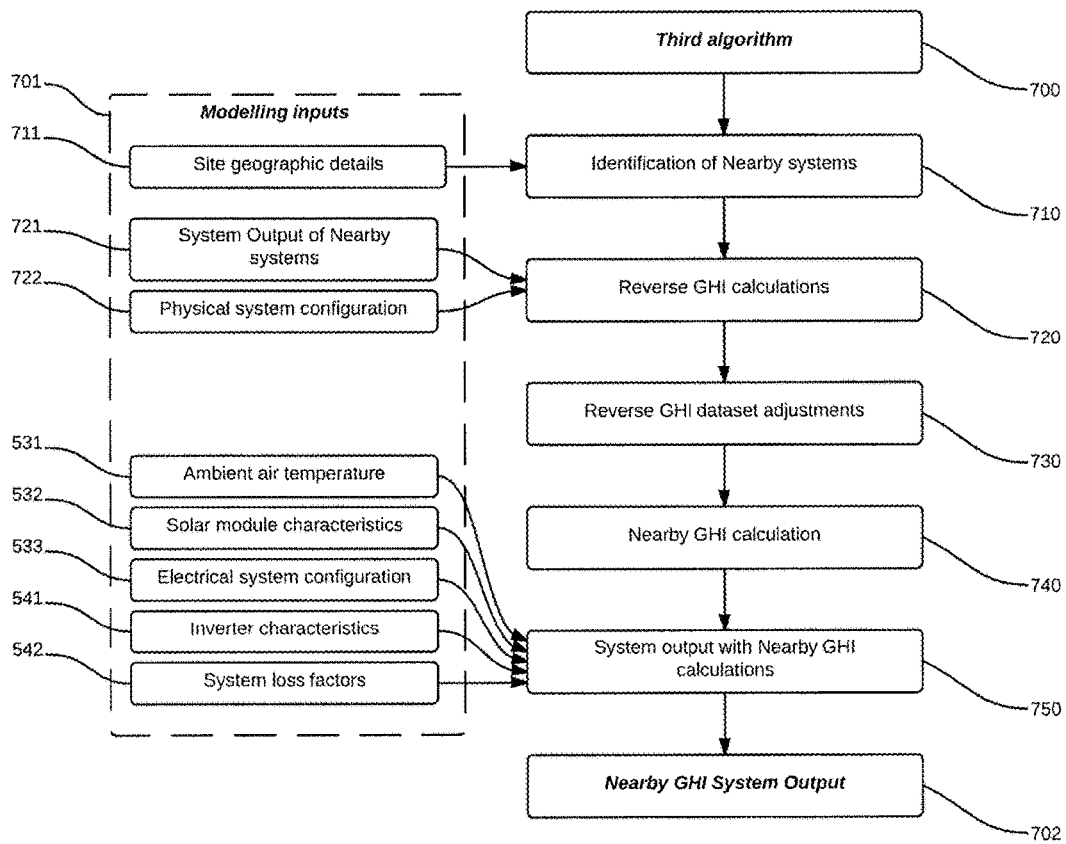
FIG. 7 diagrammatically illustrates a third algorithm for evaluation of solar photovoltaic system performance.

Referring to FIG. 7, the Third Algorithm 700 within the monitoring system implements a multi-staged algorithm to calculate the expected output 702 of the solar photovoltaic system being evaluated based on the performance on the present day of other solar photovoltaic system(s) being monitored and which are located in close geographical proximity to the solar photovoltaic system being evaluated. This algorithm is a novel implementation of the concept that output power from a solar photovoltaic system is directly related to the available solar irradiation and that this solar irradiation is common to the location and similar to surrounding geographical areas. Implementation of such an algorithm is possible now due to the sudden and rapid growth of distributed solar generation installations in recent years.

The objective of the Third Algorithm is to calculate the expected output 702 of the system in question relative to the generated output of nearby systems. Furthermore, this algorithm ensures that the input solar irradiation data is consistent with nearby locations thus correcting anomalies in the solar irradiation values for a given location.

In a sample embodiment of the Third algorithm, the process consists of five primary modelling stages;
1. Identification of nearby systems 710
2. Reverse Global Horizontal Irradiance (GHI) calculations 720
3. Reverse GHI dataset adjustment 730
4. Nearby GHI calculation 740
5. System output with Nearby GHI calculations 750

To find nearby systems the region 151 (schematically illustrated in FIG. 1) in which the plurality of solar photovoltaic systems 101-143 being monitored are installed is divided into an array of 10 km×10 km zones.

The Third Algorithm 700 identifies 710 all other monitored solar photovoltaic systems 102-105 (see FIG. 1) within the local 10 km×10 km zone containing the solar photovoltaic system 101 being monitored using site geographic details 711 in the photovoltaic installation performance database. If no such systems are found within the local 10 km×10 km zone, then 5 systems are identified in surrounding zones located in any direction up to 10, 10 km×10 km zones away from the local zone. The outputs of these other monitored solar photovoltaic systems on the present day are used in the next stage of the algorithm to determine the incident GHI on each system respectively.

All present day power outputs 721 and physical system configurations 722 of the identified systems or 5 nearest systems are used to reverse calculate the incident GHI 720 on the identified systems. This process entails reverse calculation of the stages as outlined in the First algorithm, where now the input to the processing is the systems output power and the required output is the solar irradiation. The stages of the First algorithm are rearranged in the following order;
1. Final system output calculations
2. DC system output calculation
3. Sun position calculations
4. Solar irradiation data processing The reverse calculated GHI's are then quality checked (Reverse GHI dataset adjustments 730) to ensure they are representative of the solar irradiation available in the given locale on the present day. This process is completed by excluding any reverse calculated GHI value (ReverseGHI$_X$) that has a difference that is greater than 50% of the mean of the complete reverse calculated GHI dataset (ReverseGHI$_{MEAN}$). The excluded points, as determined by the defined bounds and the formula below, are the outliers of the complete dataset.

Third alogrithm dataset boundries $$0.5 \le \frac{ReverseGHI_X}{ReverseGHI_{MEAN}} \le 1.5 \quad \text{Equation 14}$$

The mean of the reverse calculated GHI of the identified nearby systems excluding the outliers as defined above, is the Nearby GM (GHI$_{NEARBY}$) 740. The final stage of the Third algorithm is the re-calculation of the output 750 of the solar photovoltaic system in question for the present day using this Nearby GHI 740 as defined above. Essentially, this is an implementation of the First algorithm with a new input value for solar irradiation. The steps to complete this stage, as defined in the First algorithm 500, are listed below.
1. Sun position calculations 510
2. Solar irradiation data processing 520
3. DC system output calculation 530
4. Final system output calculations 540

The output of the Third algorithm is the expected output of the solar photovoltaic system in question as per performance of geographically nearby solar photovoltaic systems.

Fourth Algorithm

Figure 8:
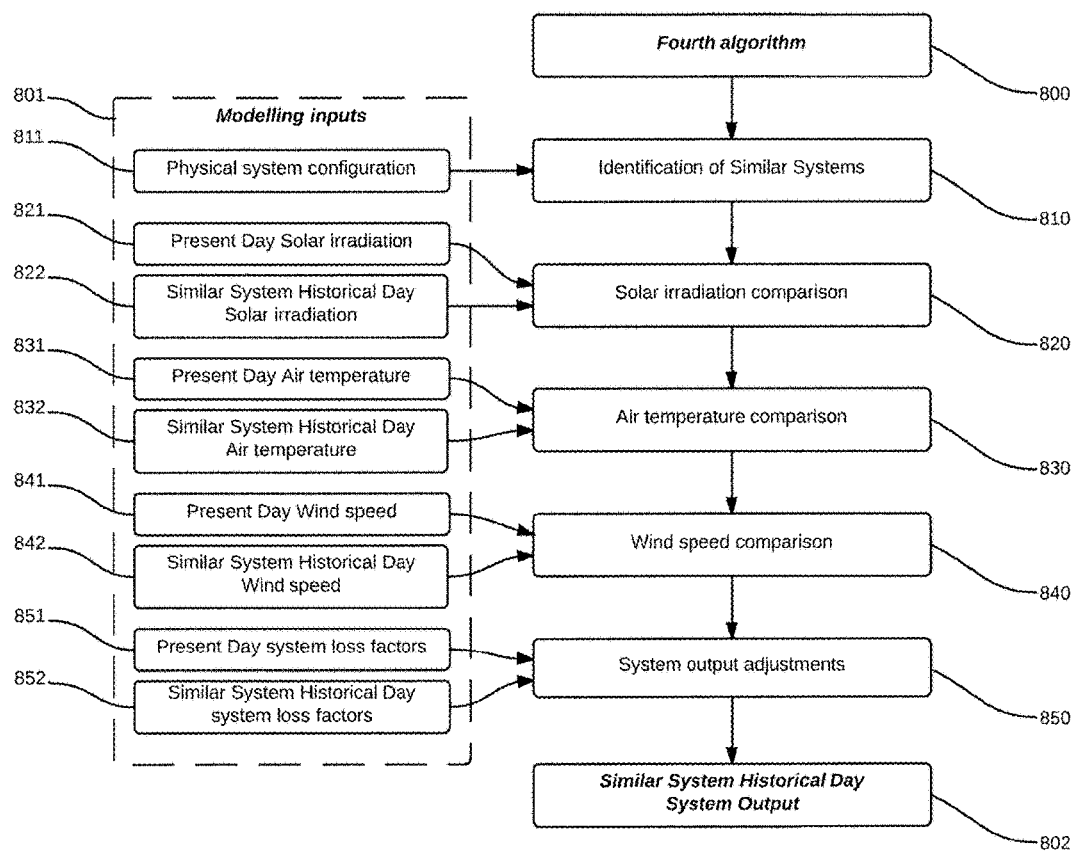
FIG. 8 diagrammatically illustrates a fourth algorithm for evaluation of solar photovoltaic system performance.

Referring to FIG. 8, the Fourth Algorithm 800 within the monitoring system implements a model to extract output from any system(s) that are similarly configured to the system in question under similar meteorological conditions historically. This algorithm allows comparison to similar systems anywhere, at any time historically given that the meteorological conditions match.

In a sample embodiment of the Fourth algorithm, the process consists of six primary modelling processes;
1. Identification of similar systems 810
2. Solar irradiation comparison 820
3. Air temperature comparison 830
4. Wind speed comparison 840
5. System output adjustments 850

Firstly, a search for installed systems having the same physical configuration is performed 810 using physical system configuration data 811 in the photovoltaic installation performance database. Two parameters are used to compare the systems physically. These are; the tilt angle of the installation and the orientation/azimuth of the installation.

When comparing the tilt angle of the installations, the difference in the tilt angle must be less than or equal to 10 degrees in absolute values between the solar photovoltaic system (SYSTEM) and the comparison system (COMPARISON).

$$|\text{Tilt Angle}_{SYSTEM} - \text{Tilt Angle}_{COMPARISON}| \leq 5°$$

Equation 15: Fourth algorithm tilt angle comparison

When comparing the azimuth or orientation of the installations, the difference in the azimuth must be less than or equal to 10 degrees in absolute values between the solar photovoltaic system (SYSTEM) and the comparison system (COMPARISON).

$$|\text{Azimuth}_{SYSTEM} - \text{Azimuth}_{COMPARISON}| \leq 10°$$

Equation 16: Fourth algorithm azimuth comparison

Once these parameters have been matched, a similar system can be identified to continue processing to meet the objective of the Fourth algorithm. In each of the next three processes of the Fourth algorithm, the relevant meteorological parameter values are compared to the corresponding present day values to identify suitable days historically where a similar system output would be expected. Each of these three stages has a different tolerance margin dependent on its impact on overall energy generation of a solar photovoltaic system.

When comparing the solar irradiation for the present day to the historical day 820, the historical day's solar irradiation values 822 must be less than or equal to 10% of the present days' corresponding solar irradiation values 821. Where a profile is unavailable for the day, the historical day's daily solar irradiation total must be less than or equal to 10% of the present day's solar irradiation total.

Second algorithm solar irradiation comparison $$0.9 \leq \frac{\text{Solar irradiation}_{HISTORICAL}}{\text{Solar irradiation}_{PRESENT}} \leq 1.1$$

Equation 17

When comparing the air temperature for the present day to the historical day 830, the historical day's air temperature values 832 must be less than or equal to 20% of the present days' corresponding air temperature values 831. Where a profile is unavailable for the day, the historical day's daily air temperature average must be less than or equal to 20% of the present day's air temperature average.

Second algorithm air temperature comparison $$0.8 \leq \frac{\text{Air temperature}_{HISTORICAL}}{\text{Air temperature}_{PRESENT}} \leq 1.2$$

Equation 18

When comparing the wind speed for the present day to the historical day 840, the historical day's air temperature values 842 must be less than or equal to 50% of the present days' corresponding wind speed values 841. Where a profile is unavailable for the day, the historical day's daily wind speed average must be less than or equal to 20% of the present day's wind speed average.

Second algorithm wind speed comparison $$0.5 \leq \frac{\text{Wind speed}_{HISTORICAL}}{\text{Wind speed}_{PRESENT}} \leq 1.5$$

Equation 19

Once these meteorological parameters are matched to a day in the similar systems' historical operation, the similar system's measured energy output can be extracted. This leads to the fifth and final modelling stage (System Output Adjustments 850) of the Fourth algorithm. This stage adjusts the historical performance of this similar system to account for expected differences in seasonal factors, aging impact and system sizing.

Firstly, the system loss factors as expected for operation on the selected historical day 852 of the similar system are adjusted to account for expected differences to the performance of the same system's operation on the present day 851. The system output adjustments 850 include, but are not limited to, adjustment of seasonal loss factors such as soiling and age dependent loss factors such as module degradation.

The adjusted output of the identified similar system on a historically similar day is then normalised. The normalised energy output of the similar system on a historically similar day is multiplied by the installed capacity of the system in question. This gives the output 802 of the Fourth algorithm.

The output of the Fourth algorithm is the expected output of the solar photovoltaic system in question as per historical performance of a similar solar photovoltaic system.

Underperformance Warning

Preliminary Statistical Analysis

Figure 9:
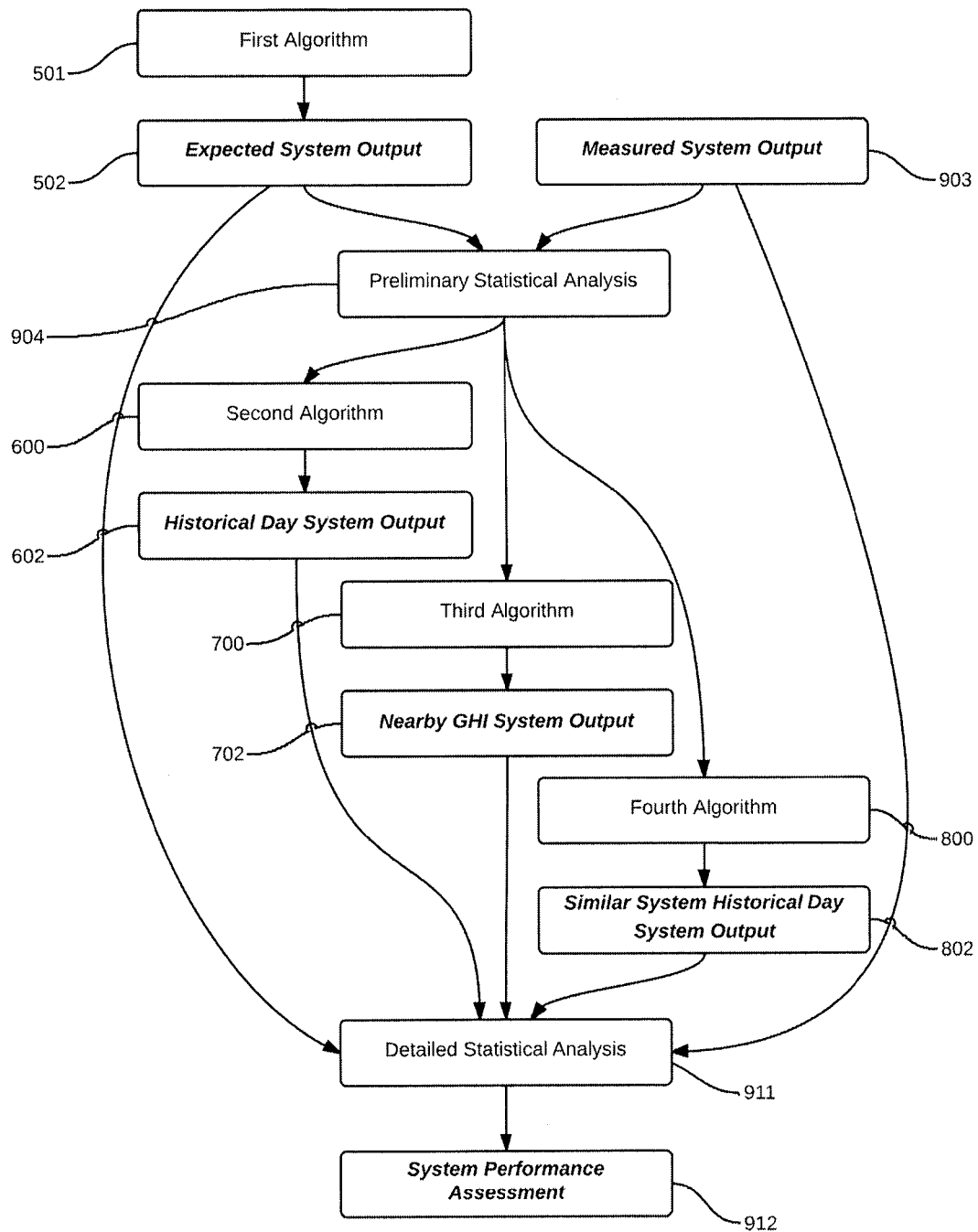

Referring to FIG. 9, the use of the four algorithms 500, 600, 700 & 800 described in the previous section is coupled with the use of comparisons using variations of a key metric, 'Delta', to trigger a system underperformance warning. In the 'preliminary analysis' 904 the expected system output 502 from the First algorithm 500 is compared to the measured system output 903 from the system in question.

Figure 10:
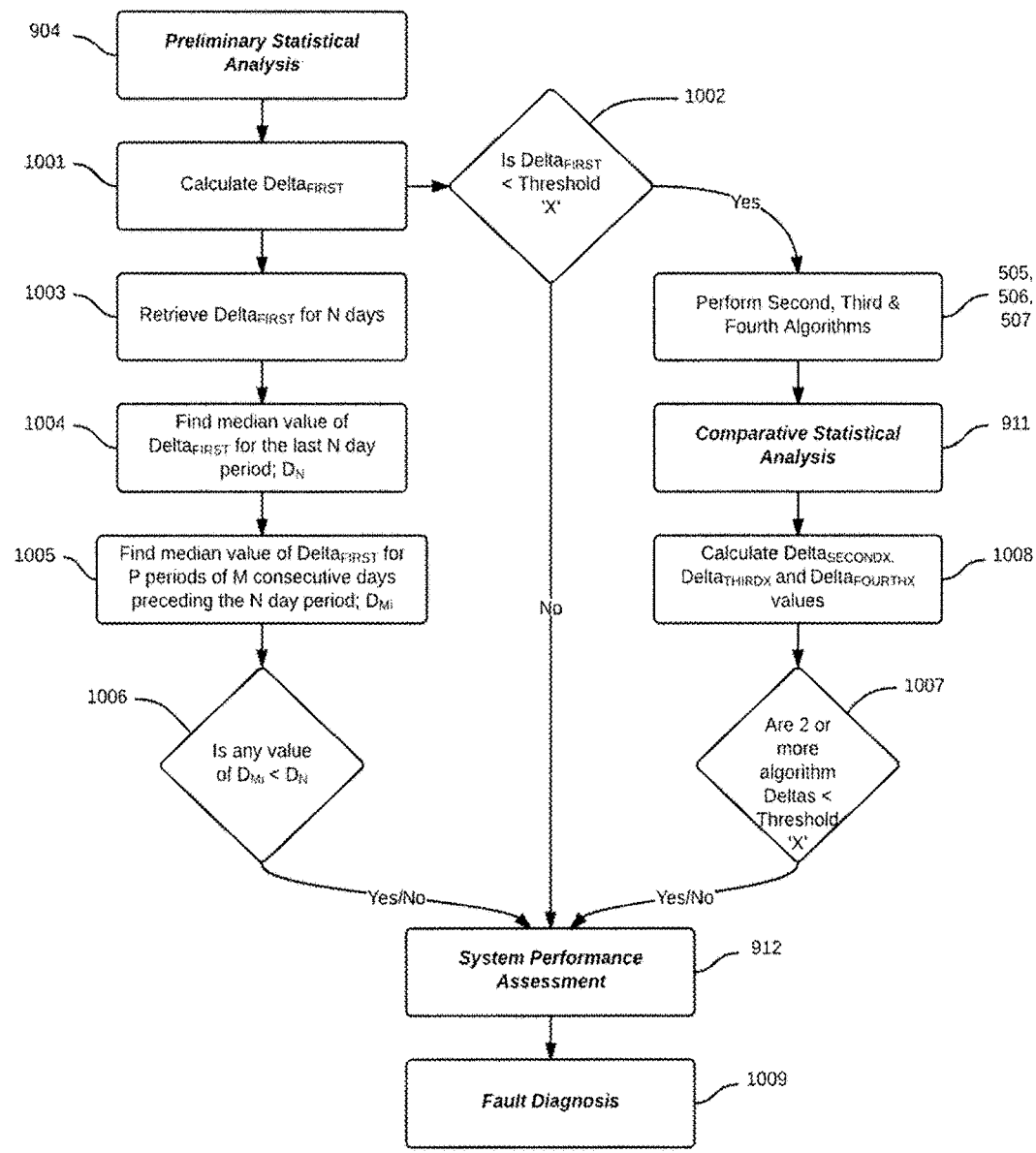
FIG. 10 diagrammatically illustrates a statistical method applied to the outcome of the first to fourth algorithms.

Referring to FIG. 10, the performance is then defined by the 'Delta$_{FIRST}$' parameter. Where Delta$_{FIRST}$ is calculated 1001 as shown below.

$$\text{Delta}_{FIRST} = \frac{\text{Measured Output}}{\text{Expected Output(First)}}$$

Where Delta$_{FIRST}$ is less than a threshold value X 1002, the Second, Third and Fourth algorithms are computed 505, 506, 507. Where Delta$_{FIRST}$ is greater than or equal to X no further algorithms are executed. In the preferred embodiment X=0.85 (i.e. Delta$_{FIRST}$<0.85), but other values of X may be appropriate depending on factors such as the expected reliability of the solar photovoltaic module.

Within the preliminary analysis 504, a secondary statistical test 1003, 1004, 1005 and 1006 is performed to check for a more gradual decline of energy generation from the system in question. A novel method of applying principles of statistical analysis has been applied to comparing system Delta$_{FIRST}$'s and detecting statistically significant events. As the distribution of Delta$_{FIRST}$'s is typically strongly non-normal, a suitable hypothesis test has been adopted for use to detect a more subtle and consistent change in system performance and is effective in finding faults or underperformance in systems that naturally overperform.

This statistical test is performed retrieving the Delta$_{FIRST}$ data for the past N days 1003 and finding the median value D$_N$ of the Delta$_{FIRST}$ data for that N day period 1004. The median value D$_{Mi}$ is calculated 1005 for each of the P subsets of Delta$_{FIRST}$ data are created for M day periods preceding the N day period. The medians of the data for each of the M day periods D$_{Mi}$ are then compared 1006 to the Median of the data for the N day period D$_N$ to check for consistent performance. If all P periods of M days are greater than the median of the initial N day period, then an underperformance event has occurred in the past N day period. Where underperformance has been detected via this statistical test, it is possible that the output of the Delta$_{FIRST}$ parameter is not less than required threshold value X as a more subtle degree of degradation or underperformance has occurred. In the event that this algorithm detects underperformance where the DeltaFIRST does not initiate execution of the Second, Third and Fourth algorithms, the fault diagnosis function (System performance assessment) 512 is initiated.

In the preferred embodiment the N day period may be 10 days and the P, M day periods may be 7 periods of 4 days each. Alternatively the value of N may be in the range of 6 to 30 days and the values of P and M may each be in the range of say 3-27.

Comparative Statistical Analysis

When the Second, Third and Fourth algorithms are executed another analysis 911 is conducted. For the Second algorithm, up to 5 'Historical day system outputs' are calculated and the corresponding Deltas computed as per the formula shown below.

$$\text{Delta}_{SECOND_X} = \frac{\text{Measured Output}}{\text{Expected Output(Second}_X)}$$

Where X is the Historical day number between 1 and 5. As the First algorithm has detected 'underperformance', it is expected that the Second algorithm will also detect underperformance. To confirm findings from the First algorithm, at minimum 4 Delta$_{SECOND_X}$'s from Second algorithm calculations must be less than 0.85.

For the Third algorithm, up to 5 'Nearby GHI system outputs' are calculated and the corresponding deltas computed as per the formula shown below.

$$\text{Delta}_{THIRD_X} = \frac{\text{Measured Output}}{\text{Expected Output(Third}_X)}$$

Where X is the Nearby system number between 1 and 5. As the First algorithm has detected underperformance, it is expected that the Third algorithm will also detect underperformance. To confirm findings from the First algorithm, at minimum 4 Delta$_{THIRD_{XX}}$'s from Third algorithm calculations must be less than 0.85.

For the Fourth algorithm, up to 5 'Similar system historical day system outputs' are calculated and the corresponding Deltas computed as per the formula shown below.

$$\text{Delta}_{FOURTH_X} = \frac{\text{Measured Output}}{\text{Expected Output(Fourth}_X)}$$

Where X is the Historical day number between 1 and 5. As the First algorithm has detected underperformance, it is expected that the Fourth algorithm will also detect underperformance. To confirm findings from the First algorithm, at minimum 4 Delta$_{FOURTH_X}$'s from Fourth algorithm calculations must be less than 0.85.

As the First, Second, Third and Fourth algorithms Deltas have been calculated, 1008, these parameters are used to make a final 'System Performance Assessment' 912 regarding the operation of the solar photovoltaic system in question. Where the findings of underperformance from the First algorithm are confirmed from any 2 of the Second, Third and Fourth algorithms, 1007, the system in question is deemed to have a confirmed fault or underperformance event to have occurred. An under performance warning is then triggered by the system.

A final Delta metric 912 is calculated to show the magnitude of the detected fault or underperformance detected. This final metric is calculated by taking the average of all calculated Deltas from algorithms that deemed a true underperformance was detected. This is the Delta$_{SP4}$ for the system that leads to the fault diagnosis function of the monitoring solution 1009

Fault Diagnosis

Once an underperformance warning is triggered via the implementation of the described algorithms 500, 600, 700, 800 & 900, the fault diagnosis function of the monitoring system assesses the event that triggered the warning, referred to hereinafter as the 'event'. In the preferred embodiment of the monitoring system, the assessment of the event is coupled with interaction with the system owner, referred to as the 'user'. This effectively allows this fault diagnosis function to help the user 'troubleshoot' the event triggering the underperformance warning and overall achieve two goals; identify a likely cause of the fault and recommend a course of action to the user.

In order to first identify the likely cause of the fault, the fault diagnosis function provides output dependent on the magnitude of reduced output as a result of the event. The procedure followed by the user is automated and thus classed into 4 categories depending on the magnitude of the underperformance detected. These categories initiate a unique sequence of interaction with the user to concurrently gather information from the user, determine the cause of underperformance and recommend and course of action to resolve the issue.

The 4 magnitude categories correspond to the system performance assessment Delta ($\text{Delta}_{SP4}$) of 0 ($\text{Delta}_{SP4}=0$), greater than 0 and less than or equal to 0.5 ($0<\text{Delta}_{SP4}<=0.5$), greater than 0.5 ($\text{Delta}_{SP4}>0.5$) and $\text{Delta}_{FIRST}$ greater than 0.85 but underperforming as detected by the preliminary statistical test outlined in the previous section ($\text{Delta}_{FIRST}>0.85$).

Where $\text{Delta}_{SP4}=0$, the likely causes are;
   System isolator is in the incorrect position
   Cable connection/join has failed
   System inverter isolator is in the incorrect position
   System inverter has failed
   Solar photovoltaic module(s) has failed
   Grid properties have required the inverter to be switched OFF
   Grid has failed (i.e. no power available from the grid)

Based on which bracket of underperformance the event has caused. The fault diagnosis function of the monitoring system can intelligently ask the user questions to determine which of the listed failures has occurred and how the recommended course of action.

In this underperformance bracket, the user is presented with the following questions to enable the fault diagnosis function to gather more information about the system. The following are examples of the questions presented to the user.
   1. Was power available to the property at the time of the event?
      If no power was available during that time, the cause of the fault was the grid had failed and no action is required.
   2. Does the inverter display an error message?
      If there is a message indicating a fault, the user is advised to call their installer and inform them what the message states. It is likely to be either failure of the solar photovoltaic module(s) or system inverter itself.
   3. Is the inverter isolator is the 'ON' position?
      If it is not 'ON', the user is advised to switch it 'ON' to correct your system failure.
   4. Are the system isolators in the correct position?
      If they are not, the user is advised to switch them to the correct position to correct the failure.

If none of the above were the cause of failure, call your installer and ask them to check the system cabling for failure. To assist the installer, the fault diagnosis function then generates a matrix of the likely faults coupled with checks the user has performed and the most likely remaining causes of failure.

Where $0<\text{Delta}_{SP4}<=0.5$, the likely causes are;
   New, large shading source has appeared in the surroundings
   One of the multiple system isolators is in the incorrect position
   Cable connection/join has failed or partially failed
   System is consistently operating over the inverters maximum power point tracking (MPPT) voltage window (overvoltage)
   System is consistently operating below the inverters maximum power point tracking (MPPT) voltage window (undervoltage)
   System inverter has experienced an internal fault
   Solar photovoltaic module breakage has occurred
   Solar photovoltaic module(s) has failed
   Grid properties have required the inverter to be switched OFF and occasionally allowing the inverter to switch ON In this underperformance bracket, the user is asked the following and the fault diagnosis function displays information accordingly;
   1. Does the inverter display an error message?
      If there is a message indicating a fault, the user is advised to call their installer and inform them what the message states. It is likely to be either failure of the solar photovoltaic module(s) or system inverter itself.
   1. Are the system isolators in the correct position?
      If they are not, switch them to the correct position to correct the failure.
   2. Is the glass visibly broken on the solar photovoltaic modules?
      If they are broken, the user is advised to call their installer replace the broken modules to correct your system failure.
   3. Are there any new large installations blocking sunlight from the solar photovoltaic modules? If so, the user is advised to remove the new installation or move the photovoltaic system as it is resulting in loss of over 50% of energy generation ability from the system.

If none of the above were the cause of failure, the fault diagnosis function of the monitoring system completes further analysis of the profile of energy generation on the given day of the event.

Where the Client application of the monitoring system is in a system component, the measured system voltage is checked against the MPPT voltage window thresholds. If the system voltage is exceeding or not reaching the tolerated voltage thresholds, the inverter operates at lower efficiencies and hence generates less energy. The user is notified accordingly. As this is a function of system sizing and inverter sizing, resolving this underperformance issue may not be cost effective.

If on this day, the energy generation profile shows sudden periods of zero energy generation during daylight hours, it is likely that the grid frequency is poor and the grid has triggered the system inverter to switch OFF for a period of time. When the grid has stabilised, the inverter switches back ON. The user is notified accordingly and the user can notify their utility to inform them this is occurring and take note of any remedies to the errors.

If none of the above were the cause of failure, call your installer and ask them to check the system cabling and the operation of the solar photovoltaic modules for failure. To assist the installer, the fault diagnosis function then generates a matrix of the likely faults coupled with checks the user and fault diagnosis function have performed and the most likely remaining causes of failure.

Where $\text{Delta}_{SP4}>0.5$, the likely causes are;
   New shading source has appeared in the surroundings
   Irregular soiling has occurred (i.e. bird droppings)
   Excessive regular soiling has occurred
   Cable connection/join has partially failed
   System is periodically operating over the inverters maximum power point tracking (MPPT) voltage window (overvoltage)
   System is periodically operating below the inverters maximum power point tracking (MPPT) voltage window (undervoltage)
   System inverter has experienced a fault
   Solar photovoltaic module(s) has degraded
   Grid requirements are periodically switching the inverter ON and OFF In this underperformance bracket, the user is asked the following and the fault diagnosis function displays information accordingly;
1. Does the inverter display an error message?
    If there is a message indicating a fault, the user is advised to call their installer and inform them what the message states. It is likely to be either failure of the solar photovoltaic module(s) or system inverter itself.
2. Is there any irregular soiling on the modules such as bird droppings?
    If so, the user is advised to clean the modules.
3. Do the modules look excessively dirty?
    If so, the user is advised clean the modules.
4. Are there any new installations or likely shading sources blocking sunlight from the solar photovoltaic modules?
    If so, the user is advised to compare the cost of removing the shading to the cost of lost revenue as this shading is the cause of underperformance.

If none of the above were the cause of failure, the fault diagnosis function of the monitoring system completes further analysis of the profile of energy generation on the given day of the event.

As in the previous underperformance bracket, where the Client application of the monitoring system is in a system component, the measured system voltage is checked against the MPPT voltage window thresholds. If the system voltage is exceeding or not reaching the tolerated voltage thresholds, the inverter operates at lower efficiencies and hence generates less energy. The user is notified accordingly. As this is a function of system sizing and inverter sizing, resolving this underperformance issue may not be cost effective.

A second detailed assessment occurs where if on this day, the energy generation profile shows sudden periods of zero energy generation during daylight hours, it is likely that the grid frequency is poor and the grid has triggered the system inverter to switch OFF for a period of time. When the grid has stabilised, the inverter switches back ON. The user is notified accordingly and the user can notify their utility to inform them this is occurring and take note of any remedies to the errors.

If none of the above were the cause of failure, call your installer and ask them to check the system cabling and the operation of the solar photovoltaic modules for failure. To assist the installer, the fault diagnosis function then generates a matrix of the likely faults coupled with checks the user and fault diagnosis function have performed and the most likely remaining causes of failure.

Where the underperformance is detected by the preliminary statistical test and $Delta_{FIRST}$ is greater than 0.85, the likely causes are similar to that in the previous bracket. Where a system is naturally over performing or very consistently performing, this statistical test will detect the event or gradual underperformance before performance is less than 85% of the expected value. The likely causes of this event are listed below;

New shading source has appeared in the surroundings
Irregular soiling has occurred (i.e. bird droppings)
Excessive regular soiling has occurred
Cable connection/join has partially failed
System is periodically operating over the inverters maximum power point tracking (MPPT) voltage window (overvoltage)
System is periodically operating below the inverters maximum power point tracking (MPPT) voltage window (undervoltage)
Solar photovoltaic module(s) has degraded
Grid requirements are periodically switching the inverter ON and OFF In this underperformance bracket, the user is asked the following and the fault diagnosis function displays information accordingly;
1. Does the inverter display an error message?
    If there is a message indicating a fault, the user is advised to call their installer and inform them what the message states. It is likely to be either failure of the solar photovoltaic module(s) or system inverter itself.
2. Is there any irregular soiling on the modules such as bird droppings?
    If so, the user is advised to clean the modules.
3. Do the modules look excessively dirty?
    If so, the user is advised clean the modules.
4. Are there any new installations or likely shading sources blocking sunlight from the solar photovoltaic modules?
    If so, the user is advised to compare the cost of removing the shading to the cost of lost revenue as this shading is the cause of underperformance.

If none of the above were the cause of failure, the fault diagnosis function of the monitoring system completes further analysis of the profile of energy generation on the given day of the event.

As in the previous underperformance bracket, where the Client application of the monitoring system is in a system component, the measured system voltage is checked against the MPPT voltage window thresholds. If the system voltage is exceeding or not reaching the tolerated voltage thresholds, the inverter operates at lower efficiencies and hence generates less energy. The user is notified accordingly. As this is a function of system sizing and inverter sizing, resolving this underperformance issue may not be cost effective.

A second detailed assessment occurs where if on this day, the energy generation profile shows sudden periods of zero energy generation during daylight hours, it is likely that the grid frequency is poor and the grid has triggered the system inverter to switch OFF for a period of time. When the grid has stabilised, the inverter switches back ON. The user is notified accordingly and the user can notify their utility to inform them this is occurring and take note of any remedies to the errors.

If none of the above were the cause of failure, call your installer and ask them to check the system cabling and the operation of the solar photovoltaic modules for failure. To assist the installer, the fault diagnosis function then generates a matrix of the likely faults coupled with checks the user and fault diagnosis function have performed and the most likely remaining causes of failure.

Where no remedy is found to resolve the cause of underperformance or where resolving the underperformance is not cost effective, the user can choose to 'ACCEPT' the underperformance. By doing so, the user allows for that specific failure mode to be tested via automated means and an 'ACCEPTED' underperformance recorded without triggering a warning. Alternately, the user may resolve the underperformance and thus reset the fault diagnosis function to notify the user when this occurs again. This is an effective feature for systems experiencing partial shading impact.

For a system where underperformance has been detected and resolved in the past, the user is first prompted to check for these issues or where required, the fault diagnosis function checks the measured energy profile for the specific fault to provide a 'smarter' fault diagnosis to the user.

Database Storage

The retrieved, processed and computed information used for the monitoring system are stored in a database. Storage of such information creates a knowledge repository for future reference and implementation within this monitoring solutions' Second and Fourth algorithms.

In a sample embodiment of this solution, a unique key identified database stores the retrieved weather data, measured system data, calculated expected output and system configuration at the relevant timestamp.

Web Application

A set of graphical user interfaces provides the user an on-line visualisation all the monitored performance of the energy generation system in question. Specifically, in relation to the preferred embodiment of the monitoring system, this on-line web application is the portal through which a user may do any or all of the following;

- View measured solar photovoltaic system energy generation at various time resolutions. This may include, but is not limited to, viewing energy generated by the system in a given hour, day, week, month or year.
- View WMO weather station data for their system's location
- View locally measured weather station data for their system's location
- View summarised indicators for system performance
- View summarised status for the system performance
- View expected energy generation at various time resolutions. This may include, but is not limited to, viewing energy generated by the system in a given hour, day, week, month or year.
- View comparative performance of the system in question relative to its own historical performance
- View comparative performance of the system in question relative to system operating in close geographical proximity
- View comparative performance of the system in question relative to similar system over a historically similar period
- Specify the electrical configuration of the system in question
- Specify the physical installation information of the system in question
- Specify the brand and model of the major components of the system in question
- Set up alerts to notify a user in the event of a system fault
- Set up alerts to notify a user of upcoming maintenance and servicing requirements
- View instances of underperformance from detailed monitoring and performance assessment
- View details of a system fault including but not limited to the time and impact of a fault
- View fault diagnosis information and recommended solutions of any fault that has occurred
- Configure the viewable results from the monitoring and assessment of the system in question
- Generate regular reports summarising the performance of the system in question
- View performance of 'friends' systems and compare to the system in question
- View the system's energy generation totals and the equivalent in standard and comparable equivalents In the preferred embodiment of this component of the monitoring system the web application enables the system performance and information to be viewed from any internet connected portal rather than only from a single location. The four main pages of the web application are the Dashboard interface, the Configuration interface, the Report interface and Friend network interface.

In this embodiment of the web application, the Dashboard interface houses the majority of the monitored data and performance assessment as outlined in the list above. The information is presented in an interactive format that initially presents a high level view as default and allows a user to 'drill down' to more detailed views through interaction with the application. The Dashboard houses the key performance measure and status as per the final assessment of the 'health' of the solar photovoltaic system in question. The Configuration interface is the section of the web application that allows the user to provide technical installation details about their system and set up system alerts. The Report interface is the section that enables a user to customise the reporting function of the monitoring system. This user interface allows selection of which results and parameters to include in the generated reports, how often to generate the specified report and view all historical reports generated by the system. The Friend networking interface enables a user to overlay normalised parameters of a Friend's system to their own system and compare performance.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A system for analysing performance of a solar photovoltaic installation comprising:
   a server remotely connected to the solar photovoltaic installation to receive data from the solar photovoltaic installation indicating a measured value of power generated during at least one period of a test day;
   a server remotely connected to the solar photovoltaic installation to receive data from the solar photovoltaic installation indicating a measured value of power generated during at least one period of a test day;
   data storage associated with the server to store the data indicating the measured value of power generated during at least one period of a test day in a solar photovoltaic installation performance database against identification information for the solar photovoltaic installation;
   an expected output determination performed by the server to determine an expected output of the solar photovoltaic installation for the at least one period of the test day using a first method;
   a comparison performed by the server to compare the first expected output of the solar photovoltaic installation with the measured value of power generated by solar photovoltaic installation for the at least one period of the test day;
   a first difference detection performed by the server to provide an out of range indication when the expected output of the solar photovoltaic installation determined by the server using the first method differs from the measured value of power generated by the solar photovoltaic installation for the at least one period of the test day by more than an acceptable tolerance;
   a further comparison performed by the server to compare the measured value of power generated by the solar photovoltaic installation for the at least one period of the test day with an expected output of the solar photovoltaic installation for the at least one period of the test day using at least one further method;

a further difference detection performed by the server to provide an under performance warning for the solar photovoltaic installation when the expected output of the solar photovoltaic installation determined by the server using the at least one further method differs from the measured power generated by the solar photovoltaic installation for the at least one period of the test day by more than an acceptable difference.

2. The system of claim 1 wherein the first and further methods of determining the expected output of the solar photovoltaic installation are selected from:
   a) using a model of the solar photovoltaic installation and irradiation data obtained from a meteorological service for the area in which the installation is located and for the at least one period of the test day to calculate an expected output of the solar photovoltaic installation for the at least one period of the test day;
   b) sing a measured value of power generated by the solar photovoltaic installation for a different day having a level of irradiation which differs by no more than 10% from the level of irradiation on the test day to determine an estimated expected output of the solar photovoltaic installation for the at least one period of the test day;
   c) calculating irradiation data by calculating reverse Global Horizontal Irradiance (GHI) for the at least one period of the test day for at least one other monitored solar photovoltaic installation and using a simulation model of the solar photovoltaic installation and the calculated GHI data to calculate an estimated expected output of the solar photovoltaic installation for the at least one period of the test day; and
   d) identifying other monitored solar photovoltaic installations, retrieving output data of the identified solar photovoltaic installations from the solar photovoltaic installation performance database for a different day having meteorological conditions including a level of irradiation which differs by no more than 10% from the solar irradiation on the test day and using the retrieved output data to calculate an estimated expected output of the solar photovoltaic installation for the at least one period of the test day.

3. The system of claim 2 wherein the first method of determining the expected output of the solar photovoltaic installation comprises using the simulation model of the solar photovoltaic installation and irradiation data obtained from a meteorological service for the area in which the installation is located and for the at least one period of the test day to calculate an expected output of the solar photovoltaic installation for the at least one period of the test day.

4. The system of claim 3 wherein the further method of calculating the expected output of the solar photovoltaic installation comprises any one of:
   a) using a measured value of power generated by the solar photovoltaic installation for a different day having a level of irradiation which differs by no more than 10% from the irradiation on the test day to determine an estimated expected output of the solar photovoltaic installation for the at least one period of the test day;
   b) calculating irradiation data by calculating reverse Global Horizontal Irradiance (GHI) for the at least one period of the test day for at least one other monitored solar photovoltaic installation and using the simulation model of the solar photovoltaic installation and the calculated GHI data to calculate an estimated expected output of the solar photovoltaic installation for the at least one period of the test day; and
   c) identifying other monitored solar photovoltaic installations, retrieving output data of the identified solar photovoltaic installations from the solar photovoltaic installation performance database for a different day having meteorological conditions including a level of irradiation which differs by no more than 10% from the solar irradiation on the test day and using the retrieved output data to calculate an estimated expected output of the solar photovoltaic installation for the at least one period of the test day.

5. The system of claim 3 wherein the further method of determining the expected output of the solar photovoltaic installation comprises performing each of:
   a) using a measured value of power generated by the solar photovoltaic installation for a different day having a level of irradiation which differs by no more than 10% from the irradiation on the test day to determine an estimated expected output of the solar photovoltaic installation for the at least one period of the test day;
   b) calculating irradiation data by calculating reverse Global Horizontal Irradiance (GHI) for the at least one period of the test day for at least one other monitored solar photovoltaic installation and using the simulation model of the solar photovoltaic installation and the calculated GM data to calculate an estimated expected output of the solar photovoltaic installation for the at least one period of the test day; and
   c) identifying other monitored solar photovoltaic installations, retrieving output data of the identified solar photovoltaic installations from the solar photovoltaic installation performance database for a different day having meteorological conditions including a level of irradiation which differs by no more than 10% from the solar irradiation on the test day and using the retrieved output data to calculate an estimated expected output of the solar photovoltaic installation for the at least one period of the test day;
   and issuing the underperformance warning if the comparisons using the further methods each results in an unacceptable difference between the expected and actual performance of the solar photovoltaic installation.

6. The system of claim 2 wherein the simulation model of the solar photovoltaic installation uses known characteristics of the solar photovoltaic installation including manufacturers rated output of the solar photovoltaic installation for standard irradiation conditions and the orientation of the solar photovoltaic installation.

7. The system of claim 1 wherein the solar photovoltaic installation includes a monitoring device comprising at least one power measuring sensor, digital data generation means to generate a digital representation of the power value measured by the power measuring sensor, encoding means to encode the digital data representation of the power value measured by the power measuring sensor into a communications signal and a transmission device to transmit the encoded digital data to a central server and the performance analysis is performed by the central server.

8. The system of claim 7 wherein the power measuring sensor is a clamp meter arranged to be clamped around a power cable.

9. The system of claim 7 wherein the clamp meter measures current and the power value is generated by multiplying the measured current by the nominal electrical potential of the cable relative to earth.

10. The system of claim 1 wherein the solar photovoltaic installation comprises an inverter having a data output providing data representing the measured value of power generated by the solar photovoltaic installation, a computer receiving the data output of the inverter and connected to the internet to transmit the data representing the measured value of power generated by the solar photovoltaic installation to a central server, and the performance analysis is performed by the central server.

11. The system as claimed in claim 1 wherein the measured value of power generated by the solar photovoltaic installation for the at least one period of the test is not within the acceptable tolerance compared to the expected output of the solar photovoltaic installation derived by the first method when:

$$\text{Delta}_{FIRST} = \frac{\text{Measured Output}}{\text{Expected Output(First)}}$$

and when:

$$\text{Delta}_{FIRST} < X$$

where Expected Output (First) is the expected output derived by the first method.

12. The method of claim 11 wherein X has a value in the range of 0.8-0.95.

13. The system of claim 11 wherein X has a value of 0.85, When $\text{Delta}_{FIRST} \geq X$, whereby the measured value of power generated by the solar photovoltaic installation for the at least one period of the test is within the acceptable tolerance, a further comparison is made of a current value of $\text{Delta}_{FIRST}$ with historical values of $\text{Delta}_{FIRST}$ may be made by taking a median of the $\text{Delta}_{FIRST}$ values for the past N days and comparing this to the median of every period of M consecutive days for up to P periods of M consecutive days within the N day period and if the median values for all P periods of M consecutive days are greater than the median of the initial N day period, then an underperformance event is deemed to have occurred in the past N day period and the step of determining an expected output of the solar photovoltaic installation for the at least one period of the test day using at least one further method is not performed.

14. The system of claim 11 wherein when $\text{Delta}_{FIRST} \geq X$, whereby the measured value of power generated by the solar photovoltaic installation for the at least one period of the test is within the acceptable tolerance, a further comparison is made of a current value of $\text{Delta}_{FIRST}$ with historical values of $\text{Delta}_{FIRST}$ by taking a median of the $\text{Delta}_{FIRST}$ values for the past N days and comparing this to the median of every period of M consecutive days for up to P periods of M consecutive days within the N day period and if the median values for all P periods of M consecutive days are greater than the median of the initial N day period, then an underperformance event is deemed to have occurred in the past N day period and the step of determining an expected output of the solar photovoltaic installation for the at least one period of the test day using at least one further method is not performed.

15. The system of claim 14 wherein N=10, M=4, and P=7.

16. A method for analysing performance of a solar photovoltaic installation comprising:

in a server remotely connected to the solar photovoltaic installation, receiving data from the solar photovoltaic installation indicating a measured value of power generated during at least one period of a test day and storing the data in a solar photovoltaic installation performance database against identification information for the solar photovoltaic installation;

the server determining an expected output of the solar photovoltaic installation for the at least one period of the test day using a first method;

the server comparing the first expected output of the solar photovoltaic installation with the measured power generated for the at least one period of the test day;

when the expected output of the solar photovoltaic installation determined by the first method differs from the measured value of power generated by the solar photovoltaic installation for the at least one period of the test day by more than an acceptable tolerance, the server determining an expected output of the solar photovoltaic installation for the at least one period of the test day using at least one further method;

when the expected output of the solar photovoltaic installation determined by the at least one further method differs from the measured value of power generated by the solar photovoltaic installation for the at least one period of the test day by more than an acceptable difference, the server issuing an under performance warning for the solar photovoltaic installation.

17. A method for analysing performance of a solar photovoltaic installation comprising:

receiving by a computer-based system for analysing performance of a solar 20 photovoltaic installation, data indicating a measured value of power generated by the solar photovoltaic installation during at least one period of a test day and storing that data in a solar photovoltaic installation performance database against identification information for the solar photovoltaic installation;

determining by the computer-based system, an expected output of the solar photovoltaic installation for the at least one period of the test day using a first method;

comparing by the computer-based system, the first expected output of the solar photovoltaic installation with the measured value of power generated for the at least one period of the test day;

when the expected output of the solar photovoltaic installation determined by the first method differs from the measured value of power generated by the solar photovoltaic installation for the at least one period of the test day by more than an acceptable tolerance, determining by the computer-based system, an expected output of the solar photovoltaic installation for the at least one period of the test day using at least one further method;

when the expected output of the solar photovoltaic installation determined by the at least one further method differs from the measured value of power generated by the solar photovoltaic installation for the at least one period of the test day by more than an acceptable difference, issuing by the computer-based system, an under performance warning for the solar photovoltaic installation.

* * * * *